United States Patent
Bhatia et al.

(10) Patent No.: US 10,970,165 B2
(45) Date of Patent: Apr. 6, 2021

(54) ENCODER AND DECODER FOR MEMORY SYSTEM AND METHOD THEREOF

(71) Applicant: SK hynix Inc., Gyeonggi-do (KR)

(72) Inventors: Aman Bhatia, San Jose, CA (US); Yu Cai, San Jose, CA (US); Naveen Kumar, San Jose, CA (US); Xuanxuan Lu, San Jose, CA (US); Chenrong Xiong, San Jose, CA (US); Fan Zhang, San Jose, CA (US)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 16/400,713

(22) Filed: May 1, 2019

(65) Prior Publication Data
US 2019/0340068 A1    Nov. 7, 2019

Related U.S. Application Data

(60) Provisional application No. 62/666,354, filed on May 3, 2018, provisional application No. 62/666,400, filed on May 3, 2018.

(51) Int. Cl.
*G06F 11/10*      (2006.01)
*G06F 7/58*       (2006.01)
(Continued)

(52) U.S. Cl.
CPC .......... *G06F 11/1068* (2013.01); *G06F 7/588* (2013.01); *G06F 11/1004* (2013.01); *G11C 29/52* (2013.01); *H03M 13/1102* (2013.01); *H03M 13/2906* (2013.01); *G06F 7/582* (2013.01)

(58) Field of Classification Search
CPC .. G06F 11/1068; G06F 7/588; G06F 11/1004; G06F 7/582; G06F 11/1012; G06F 11/1072; G11C 29/52; G11C 2029/0409; G11C 2029/0411; G11C 29/34;
(Continued)

(56) References Cited

U.S. PATENT DOCUMENTS 6,177,890 B1    1/2001    Keirn et al.
8,127,200 B2    2/2012    Sharon et al.
(Continued)

OTHER PUBLICATIONS

W. Lee, M. Kang, S. Hong and S. Kim, "Interpage-Based Endurance-Enhancing Lower State Encoding for MLC and TLC Flash Memory Storages," in IEEE Transactions on Very Large Scale Integration (VLSI) Systems, vol. 27, No. 9, pp. 2033-2045, Sep. 2019. (Year: 2019).*

(Continued)

*Primary Examiner* — Cynthia Britt
(74) *Attorney, Agent, or Firm* — IP & T Group LLP

(57) ABSTRACT

Encoders and decoders are provided for memory systems. An encoder scrambles data bits corresponding to a logical page, selected from among multiple logical pages, using a plurality of random sequences, to generate a plurality of scrambled sequences; selects, as an encoded sequence, a scrambled sequence among the plurality of scrambled sequences; and provides a memory device with the encoded sequence to store the encoded sequence in multiple level cells. The selected scrambled sequence has the lowest number of logical high values among the plurality of scrambled sequences.

23 Claims, 25 Drawing Sheets

(51) Int. Cl.
*G11C 29/52* (2006.01)
*H03M 13/11* (2006.01)
*H03M 13/29* (2006.01)

(58) Field of Classification Search
CPC .... G11C 16/10; G11C 29/42; H03M 13/1102; H03M 13/2906
See application file for complete search history.

(56) References Cited

U.S. PATENT DOCUMENTS

| | | | |
|---|---|---|---|
| 9,741,431 B2 | 8/2017 | Kumar et al. | |
| 2012/0297271 A1 | 11/2012 | Sommer et al. | |
| 2013/0101111 A1* | 4/2013 | Sharon | G11B 20/0021 380/28 |
| 2015/0378890 A1* | 12/2015 | Lien | G11C 8/06 711/159 |
| 2016/0070506 A1* | 3/2016 | Blaettler | G11C 7/1006 711/154 |
| 2017/0192908 A1 | 7/2017 | Blaettler et al. | |
| 2019/0213074 A1* | 7/2019 | Bhatia | G11C 11/5642 |
| 2019/0377635 A1* | 12/2019 | Xiong | H03M 13/3723 |

OTHER PUBLICATIONS

W. Y. H. Wilson, K. A. S. Immink, Xu Bao Xi and Chong Tow Chong, "Guided scrambling: a new coding technique for holographic storage," 2000 Optical Data Storage. Conference Digest (Cat. No. 00TH8491), Whisler, BC, Canada, 2000, pp. 110-112. (Year: 2000).*

B. Shin, C. Seol, J. Chung and J. J. Kong, "Error control coding and signal processing for flash memories," 2012 IEEE International Symposium on Circuits and Systems (ISCAS), Seoul, 2012, pp. 409-412. (Year: 2012).*

Y. Cai, S. Ghose, E. F. Haratsch, Y. Luo and O. Mutlu, "Error Characterization, Mitigation, and Recovery in Flash-Memory-Based Solid-State Drives," in Proceedings of the IEEE, vol. 105, No. 9, pp. 1666-1704, Sep. 2017. (Year: 2017).*

A. P. Hekstra and L. M. G. M. Tolhuizen, "Guaranteed scrambling," in IEEE Transactions on Magnetics, vol. 41, No. 11, pp. 4323-4326, Nov. 2005. (Year: 2005).*

* cited by examiner

ENCODER AND DECODER FOR MEMORY SYSTEM AND METHOD THEREOF

CROSS-REFERENCE TO RELATED APPLICATION

This application claims the benefit of U.S. Provisional Application Nos. 62/666,354 and 62/666,400, filed on May 3, 2018, the entire contents of which are incorporated herein by reference.

BACKGROUND

1. Field

Embodiments of the present disclosure relate to encoding and decoding schemes for a memory system.

2. Description of the Related Art

The computer environment paradigm has shifted to ubiquitous computing systems that can be used anytime and anywhere. As a result, the use of portable electronic devices such as mobile phones, digital cameras, and notebook computers has rapidly increased. These portable electronic devices generally use a memory system having memory device(s), that is, data storage device(s). The data storage device is used as a main memory device or an auxiliary memory device of the portable electronic devices.

Memory systems using memory devices provide excellent stability, durability, high information access speed, and low power consumption, since they have no moving parts. Examples of memory systems having such advantages include universal serial bus (USB) memory devices, memory cards having various interfaces such as a universal flash storage (UFS), and solid state drives (SSDs). Memory systems may use various kinds of encoder and decoder.

SUMMARY

Aspects of the present invention include a memory system including an encoder and a decoder for reducing occurrences of a bit having a certain value.

In one aspect, a memory system includes a memory device including multiple level cells, in which an encoded sequence is stored and a controller including a encoder. The encoder scrambles data bits corresponding to a logical page, selected from among multiple logical pages, using a plurality of random sequences, to generate a plurality of scrambled sequences; selects, as an encoded sequence, a scrambled sequence among the plurality of scrambled sequences; and provides the memory device with the encoded sequence to store the encoded sequence in the multiple level cells. The selected scrambled sequence has the lowest number of logical high values among the plurality of scrambled sequences.

In another aspect, a memory system includes a memory device including multiple level cells, in which an encoded sequence is stored and a controller including a decoder. The decoder receives from the memory device, the encoded sequence and indication information; selects a random sequence among a plurality of random sequences, based on the indication information; and descrambles the encoded sequence using the selected random sequence to generate a descrambled sequence as data bits corresponding to a logical page, selected from among multiple logical pages. The indication information indicates the random sequence corresponding to a scrambled sequence having a lowest number of logical high values, among a plurality of scrambled sequences, which is generated by scrambling the data bits using the plurality of random sequences.

In still another aspect, a memory system includes a memory device including multiple level cells, in which an encoded sequence is stored and a controller including a decoder. The decoder receives, from the memory device, the encoded sequence; decodes the encoded sequence using a low density parity check (LDPC) code to generate an LDPC decoded sequence; descrambles the LDPC decoded sequence using a plurality of random sequences, to generate a plurality of descrambled sequences; and selects a descrambled sequence to be recovered among the plurality of descrambled sequences, based on cyclic redundancy check (CRC) syndromes of the plurality of descrambled sequences, to generate a recovered sequence including data bits corresponding to a logical page, selected from among multiple logical pages. The selected descrambled sequence has the lowest number of logical high values, among a plurality of scrambled sequences, which were generated by scrambling the data bits using the plurality of random sequences.

Additional aspects of the present invention will become apparent from the following description.

DETAILED DESCRIPTION

Figure 1:
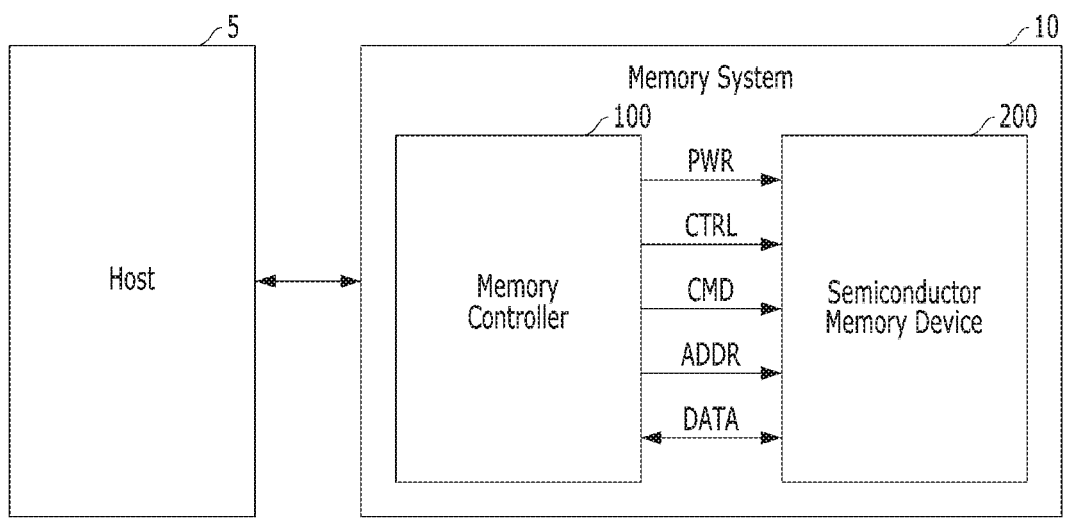
FIG. 1 is a block diagram illustrating a data processing system in accordance with an embodiment of the present invention.

Various embodiments are described below in more detail with reference to the accompanying drawings. The present invention may, however, be embodied in different forms and thus should not be construed as limited to the embodiments set forth herein. Rather, these embodiments are provided so that this disclosure is thorough and complete and fully conveys the scope of the present invention to those skilled in the art. Moreover, reference herein to "an embodiment," "another embodiment," or the like is not necessarily to only one embodiment, and different references to any such phrase are not necessarily to the same embodiment(s). Throughout the disclosure, like reference numerals refer to like parts in the figures and embodiments of the present invention.

The invention can be implemented in numerous ways, including as a process; an apparatus; a system; a computer program product embodied on a computer-readable storage medium; and/or a processor, such as a processor suitable for executing instructions stored on and/or provided by a memory coupled to the processor. In this specification, these implementations, or any other form that the invention may take, may be referred to as techniques. In general, the order of the steps of disclosed processes may be altered within the scope of the invention. Unless stated otherwise, a component such as a processor or a memory described as being suitable for performing a task may be implemented as a general component that is temporarily configured to perform the task at a given time or a specific component that is manufactured to perform the task. As used herein, the term 'processor' or the like refers to one or more devices, circuits, and/or processing cores suitable for processing data, such as computer program instructions.

A detailed description of embodiments of the invention is provided below along with accompanying figures that illustrate aspects of the invention. The invention is described in connection with such embodiments, but the invention is not limited to any embodiment. The scope of the invention is limited only by the claims. The invention encompasses numerous alternatives, modifications and equivalents within the scope of the claims. Numerous specific details are set forth in the following description in order to provide a thorough understanding of the invention. These details are provided for the purpose of example; the invention may be practiced according to the claims without some or all of these specific details. For clarity, technical material that is known in technical fields related to the invention has not been described in detail so that the invention is not unnecessarily obscured.

FIG. 1 is a block diagram illustrating a data processing system 2 in accordance with an embodiment of the present invention.

Referring FIG. 1, the data processing system 2 may include a host device 5 and a memory system 10. The memory system 10 may receive a request from the host device 5 and operate in response to the received request. For example, the memory system 10 may store data to be accessed by the host device 5.

The host device 5 may be implemented with any one of various kinds of electronic devices. In various embodiments, the host device 5 may include an electronic device such as a desktop computer, a workstation, a three-dimensional (3D) television, a smart television, a digital audio recorder, a digital audio player, a digital picture recorder, a digital picture player, and/or a digital video recorder and a digital video player. In various embodiments, the host device 5 may include a portable electronic device such as a mobile phone, a smart phone, an e-book, an MP3 player, a portable multimedia player (PMP), and/or a portable game player.

The memory system 10 may be implemented with any one of various kinds of storage devices such as a solid state drive (SSD) and a memory card. In various embodiments, the memory system 10 may be provided as one of various components in an electronic device such as a computer, an ultra-mobile personal computer (PC) (UMPC), a workstation, a net-book computer, a personal digital assistant (PDA), a portable computer, a web tablet PC, a wireless phone, a mobile phone, a smart phone, an e-book reader, a portable multimedia player (PMP), a portable game device, a navigation device, a black box, a digital camera, a digital multimedia broadcasting (DMB) player, a 3-dimensional television, a smart television, a digital audio recorder, a digital audio player, a digital picture recorder, a digital picture player, a digital video recorder, a digital video player, a storage device of a data center, a device capable of receiving and transmitting information in a wireless environment, a radio-frequency identification (RFID) device, as well as one of various electronic devices of a home network, one of various electronic devices of a computer network, one of electronic devices of a telematics network, or one of various components of a computing system.

The memory system 10 may include a memory controller 100 and a semiconductor memory device 200. The memory controller 100 may control overall operations of the semiconductor memory device 200.

The semiconductor memory device 200 may perform one or more erase, program, and read operations under the control of the memory controller 100. The semiconductor memory device 200 may receive a command CMD, an address ADDR and data DATA through input/output lines. The semiconductor memory device 200 may receive power PWR through a power line and a control signal CTRL through a control line. The control signal CTRL may include a command latch enable signal, an address latch enable signal, a chip enable signal, a write enable signal, a read enable signal, as well as other operational signals depending on design and configuration of the memory system 10.

The memory controller 100 and the semiconductor memory device 200 may be integrated in a single semiconductor device such as a solid state drive (SSD). The SSD may include a storage device for storing data therein. When the semiconductor memory system 10 is used in an SSD, operation speed of a host device (e.g., host device 5 of FIG. 1) coupled to the memory system 10 may remarkably improve.

The memory controller 100 and the semiconductor memory device 200 may be integrated in a single semiconductor device such as a memory card. For example, the memory controller 100 and the semiconductor memory device 200 may be so integrated to configure a personal computer (PC) card of personal computer memory card international association (PCMCIA), a compact flash (CF) card, a smart media (SM) card, a memory stick, a multimedia card (MMC), a reduced-size multimedia card (RS-MMC), a micro-size version of MMC (MMCmicro), a secure digital (SD) card, a mini secure digital (miniSD) card, a micro secure digital (microSD) card, a secure digital high capacity (SDHC), and/or a universal flash storage (UFS).

Figure 2:
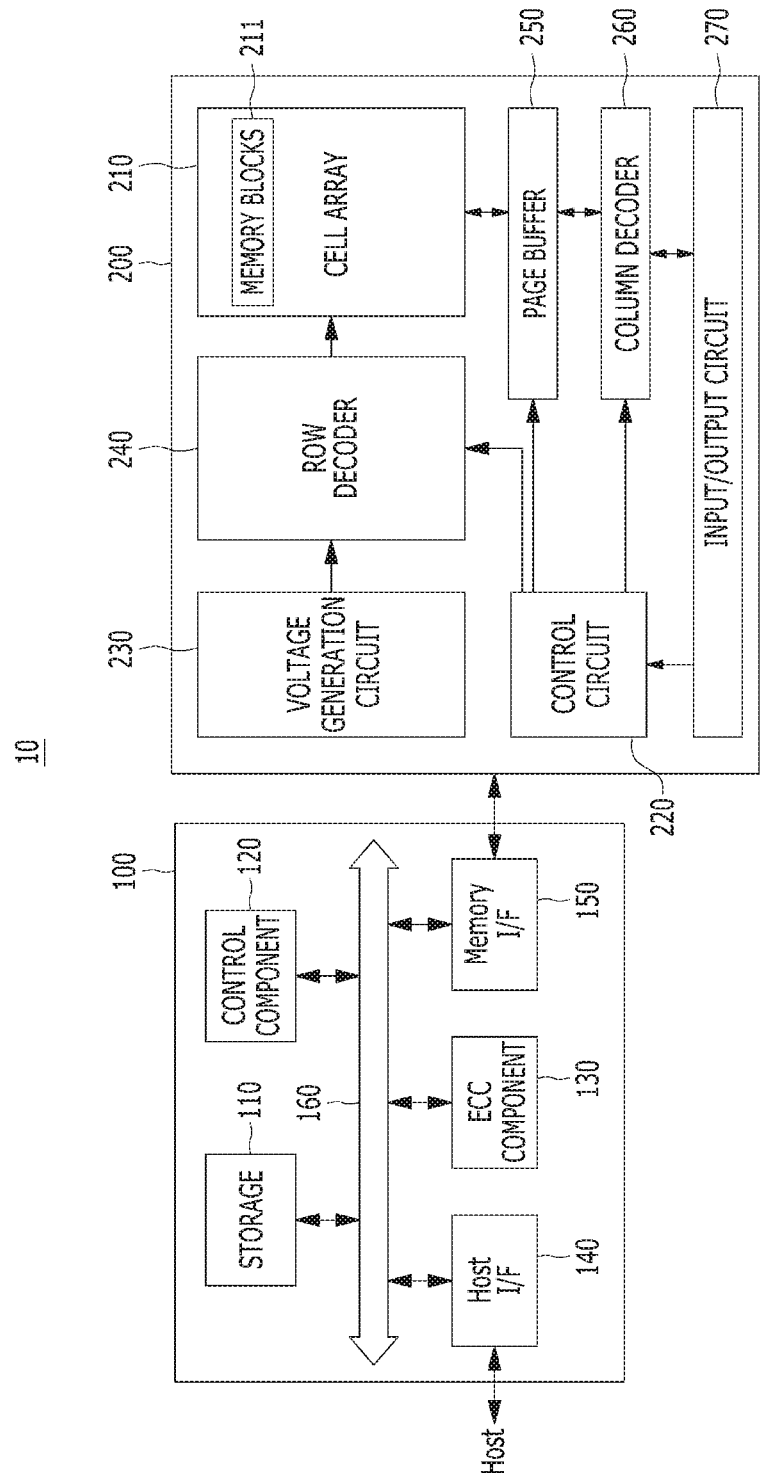
FIG. 2 is a block diagram illustrating a memory system in accordance with an embodiment of the present invention.

FIG. 2 is a block diagram illustrating a memory system in accordance with an embodiment of the present invention. For example, the memory system of FIG. 2 may depict the memory system 10 shown in FIG. 1.

Referring to FIG. 2, the memory system 10 may include a memory controller 100 and a semiconductor memory device 200. The memory system 10 may operate in response to a request from a host device (e.g., host device 5 of FIG. 1), and in particular, store data to be accessed by the host device.

The memory device 200 may store data to be accessed by the host device.

The memory device 200 may be implemented with a volatile memory device such as a dynamic random access memory (DRAM) and/or a static random access memory (SRAM) or a non-volatile memory device such as a read only memory (ROM), a mask ROM (MROM), a programmable ROM (PROM), an erasable programmable ROM (EPROM), an electrically erasable programmable ROM (EEPROM), a ferroelectric random access memory (FRAM), a phase change RAM (PRAM), a magnetoresistive RAM (MRAM), and/or a resistive RAM (RRAM).

The controller 100 may control storage of data in the memory device 200. For example, the controller 100 may control the memory device 200 in response to a request from the host device. The controller 100 may provide data read from the memory device 200 to the host device, and may store data provided from the host device into the memory device 200.

The controller 100 may include a storage 110, a control component 120, which may be implemented as a processor such as a central processing unit (CPU), an error correction code (ECC) component 130, a host interface (I/F) 140 and a memory interface (I/F) 150, which are coupled through a bus 160.

The storage 110 may serve as a working memory of the memory system 10 and the controller 100, and store data for driving the memory system 10 and the controller 100. When the controller 100 controls operations of the memory device 200, the storage 110 may store data used by the controller 100 and the memory device 200 for such operations as read, write, program and erase operations.

The storage 110 may be implemented with a volatile memory such as a static random access memory (SRAM) or a dynamic random access memory (DRAM). As described above, the storage 110 may store data used by the host device in the memory device 200 for the read and write operations. To store the data, the storage 110 may include a program memory, a data memory, a write buffer, a read buffer, a map buffer, and the like.

The control component 120 may control general operations of the memory system 10, and a write operation or a read operation for the memory device 200, in response to a write request or a read request from the host device. The control component 120 may drive firmware, which is referred to as a flash translation layer (FTL), to control general operations of the memory system 10. For example, the FTL may perform operations such as logical-to-physical (L2P) mapping, wear leveling, garbage collection, and/or bad block handling. The L2P mapping is known as logical block addressing (LBA).

The ECC component 130 may detect and correct errors in the data read from the memory device 200 during the read operation. The ECC component 130 may not correct error bits when the number of the error bits is greater than or equal to a threshold number of correctable error bits, and instead may output an error correction fail signal indicating failure in correcting the error bits.

In various embodiments, the ECC component 130 may perform an error correction operation based on a coded modulation such as a low density parity check (LDPC) code, a Bose-Chaudhuri-Hocquenghem (BCH) code, a turbo code, a turbo product code (TPC), a Reed-Solomon (RS) code, a convolution code, a recursive systematic code (RSC), a trellis-coded modulation (TCM), or a Block coded modulation (BCM). However, error correction is not limited to these techniques. As such, the ECC component 130 may include any and all circuits, systems or devices for suitable error correction operation.

The host interface 140 may communicate with the host device through one or more of various interface protocols such as a universal serial bus (USB), a multi-media card (MMC), a peripheral component interconnect express (PCI-e or PCIe), a small computer system interface (SCSI), a serial-attached SCSI (SAS), a serial advanced technology attachment (SATA), a parallel advanced technology attachment (PATA), an enhanced small disk interface (ESDI), and an integrated drive electronics (IDE).

The memory interface 150 may provide an interface between the controller 100 and the memory device 200 to allow the controller 100 to control the memory device 200 in response to a request from the host device. The memory interface 150 may generate control signals for the memory device 200 and process data under the control of the control component 120. When the memory device 200 is a flash memory such as a NAND flash memory, the memory interface 150 may generate control signals for the memory and process data under the control of the control component 120.

The memory device 200 may include a memory cell array 210, a control circuit 220, a voltage generation circuit 230, a row decoder 240, a page buffer 250, which may be in the form of an array of page buffers, a column decoder 260, and an input and output (input/output) circuit 270. The memory cell array 210 may include a plurality of memory blocks 211 which may store data. The voltage generation circuit 230, the row decoder 240, the page buffer array 250, the column decoder 260 and the input/output circuit 270 may form a peripheral circuit for the memory cell array 210. The peripheral circuit may perform a program, read, or erase operation of the memory cell array 210. The control circuit 220 may control the peripheral circuit.

The voltage generation circuit 230 may generate operation voltages of various levels. For example, in an erase operation, the voltage generation circuit 230 may generate operation voltages of various levels such as an erase voltage and a pass voltage.

The row decoder 240 may be in electrical communication with the voltage generation circuit 230, and the plurality of memory blocks 211. The row decoder 240 may select at least one memory block among the plurality of memory blocks 211 in response to a row address generated by the control circuit 220, and transmit operation voltages supplied from the voltage generation circuit 230 to the selected memory blocks.

Figure 3:
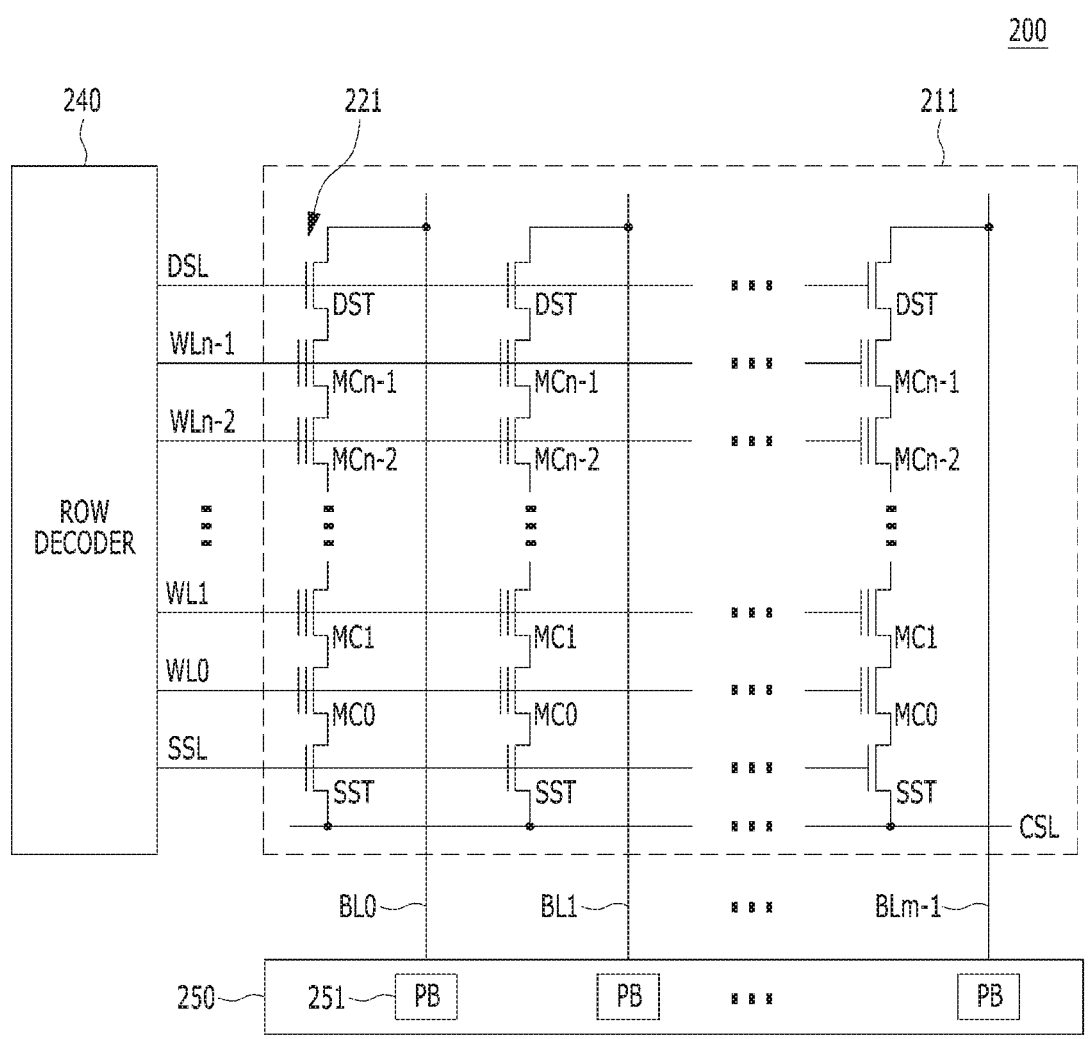
FIG. 3 is a circuit diagram illustrating a memory block of a memory device in accordance with an embodiment of the present invention.

The page buffer 250 may be coupled with the memory cell array 210 through bit lines BL (shown in FIG. 3). The page buffer 250 may precharge the bit lines BL with a positive voltage, transmit data to, and receive data from, a selected memory block in program and read operations, or temporarily store transmitted data, in response to page buffer control signal(s) generated by the control circuit 220.

The column decoder 260 may transmit data to, and receive data from, the page buffer 250 or transmit and receive data to and from the input/output circuit 270.

The input/output circuit 270 may transmit to the control circuit 220 a command and an address, received from an external device (e.g., the memory controller 100 of FIG. 1), transmit data from the external device to the column decoder 260, or output data from the column decoder 260 to the external device, through the input/output circuit 270.

The control circuit 220 may control the peripheral circuit in response to the command and the address.

FIG. 3 is a circuit diagram illustrating a memory block of a semiconductor memory device in accordance with an embodiment of the present invention. For example, the memory block of FIG. 3 may be any of the memory blocks 211 of the memory cell array 210 shown in FIG. 2.

Referring to FIG. 3, the exemplary memory block 211 may include a plurality of word lines WL0 to WLn−1, a drain select line DSL and a source select line SSL coupled to the row decoder 240. These lines may be arranged in parallel, with the plurality of word lines between the DSL and SSL.

The exemplary memory block 211 may further include a plurality of cell strings 221 respectively coupled to bit lines BL0 to BLm−1. The cell string of each column may include one or more drain selection transistors DST and one or more source selection transistors SST. In the illustrated embodiment, each cell string has one DST and one SST. In a cell string, a plurality of memory cells or memory cell transistors MC0 to MCn−1 may be serially coupled between the selection transistors DST and SST. Each of the memory cells may be formed as a multiple level cell. For example, each of the memory cells may be formed as a single level cell (SLC) storing 1 bit of data. Each of the memory cells may be formed as a multi-level cell (MLC) storing 2 bits of data. Each of the memory cells may be formed as a triple-level cell (TLC) storing 3 bits of data. Each of the memory cells may be formed as a quadruple-level cell (QLC) storing 4 bits of data.

The source of the SST in each cell string may be coupled to a common source line CSL, and the drain of each DST may be coupled to the corresponding bit line. Gates of the SSTs in the cell strings may be coupled to the SSL, and gates of the DSTs in the cell strings may be coupled to the DSL. Gates of the memory cells across the cell strings may be coupled to respective word lines. That is, the gates of memory cells MC0 are coupled to corresponding word line WL0, the gates of memory cells MC1 are coupled to corresponding word line WL1, etc. The group of memory cells coupled to a particular word line may be referred to as a physical page. Therefore, the number of physical pages in the memory block 211 may correspond to the number of word lines.

The page buffer array 250 may include a plurality of page buffers 251 that are coupled to the bit lines BL0 to BLm−1. The page buffers 251 may operate in response to page buffer control signals. For example, the page buffers 251 may temporarily store data received through the bit lines BL0 to BLm−1 or sense voltages or currents of the bit lines during a read or verify operation.

In some embodiments, the memory blocks 211 may include a NAND-type flash memory cell. However, the memory blocks 211 are not limited to such cell type, but may include NOR-type flash memory cell(s). Memory cell array 210 may be implemented as a hybrid flash memory in which two or more types of memory cells are combined, or one-NAND flash memory in which a controller is embedded inside a memory chip.

In some embodiments, the memory blocks 211 may include a NAND-type flash memory cell. However, the memory blocks 211 are not limited to such cell type, but may include NOR-type flash memory cell(s). Memory cell array 210 may be implemented as a hybrid flash memory in which two or more types of memory cells are combined, or one-NAND flash memory in which a controller is embedded inside a memory chip.

Memory devices such as a flash memory may store multiple bits per cell by modulating the cell into different states or voltage levels using a programming operation.

Figure 4A:
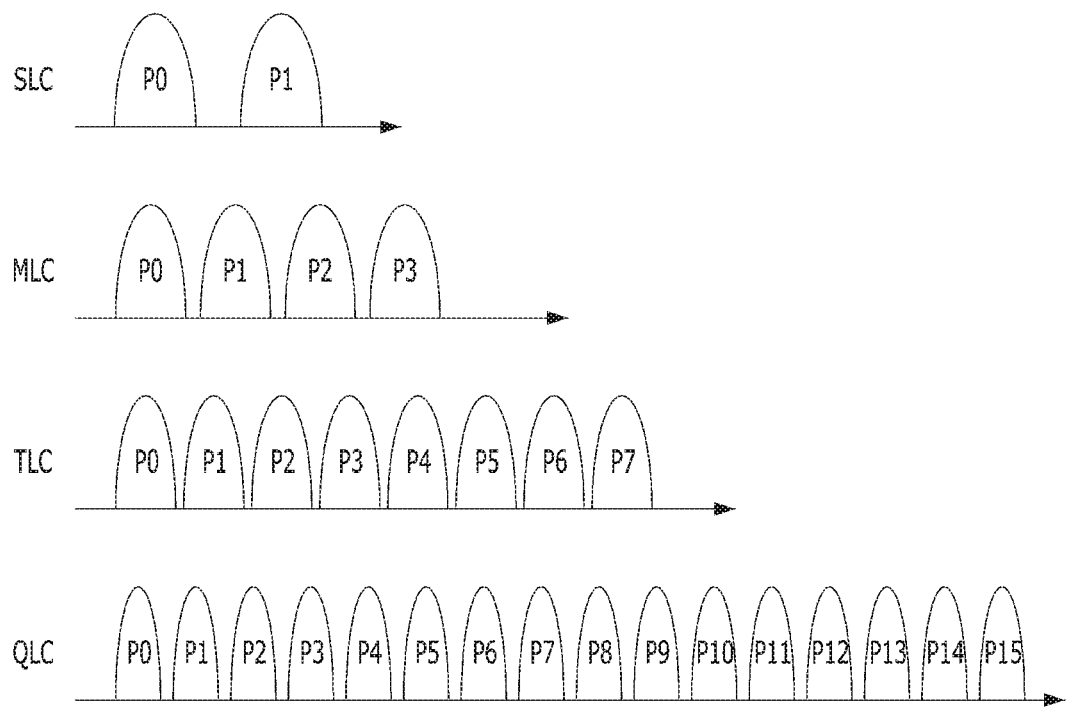
FIGS. 4A and 4B are diagrams illustrating distributions of states for cells of a memory device.
Figure 4B:
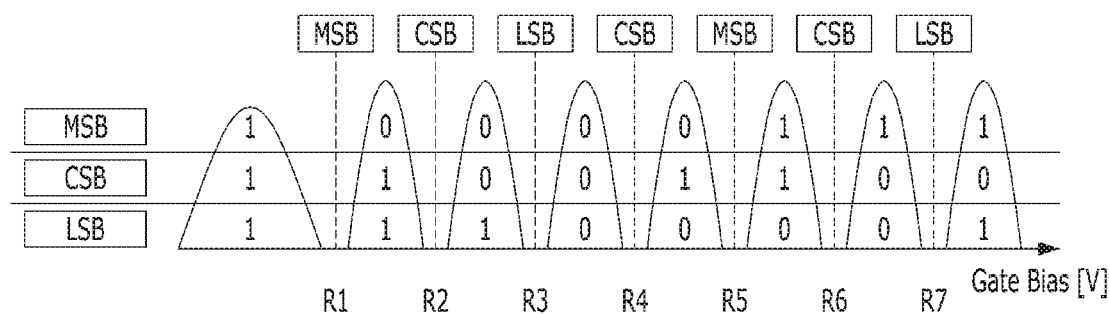

FIGS. 4A and 4B are diagrams illustrating distributions of program states or voltage (PV) levels for different types of cells of a memory device.

Referring to FIG. 4A, each of memory cells of the memory blocks may be implemented with multiple level cells, for example, a single level cell (SLC) storing 1 bit of data, a multi-level cell (MLC) storing 2 bits of data, a triple-level cell (TLC) storing 3 bits of data, or a quadruple-level cell (QLC) storing 4 bits of data.

SLCs may include two states P0 and P1. P0 may indicate an erase state, and P1 may indicate a program state. Since the SLC can be set in one of two different states, each SLC may program or store 1 bit according to a set coding method. MLCs may include four states P0, P1, P2 and P3. Among these states, P0 may indicate an erase state, and P1 to P3 may indicate program states. Since the MLC can be set in one of four different states, each MLC may program or store two bits according to a set coding method. TLCs may include eight states P0 to P7. Among these states, P0 may indicate an erase state, and P1 to P7 may indicate program states. Since the TLC can be set in one of eight different states, each TLC may program or store three bits according to a set coding method. QLCs may include 16 states P0 to P15. Among these states, P0 may indicate an erase state, and P1 to P15 may indicate program states. Since the QLC can be set in one of sixteen different states, each QLC may program or store four bits according to a set coding method.

Referring to FIG. 4B, for the TLC flash memory device, each of cells may have 8 states and 7 PV levels R1 to R7 for identifying the 8 states. Each state corresponds to a unique 3-bit tuple. The first, second and third bits of the cells are grouped together into least significant bit (LSB), center significant bit (CSB) and most significant bit (MSB) pages, respectively.

Figure 5:
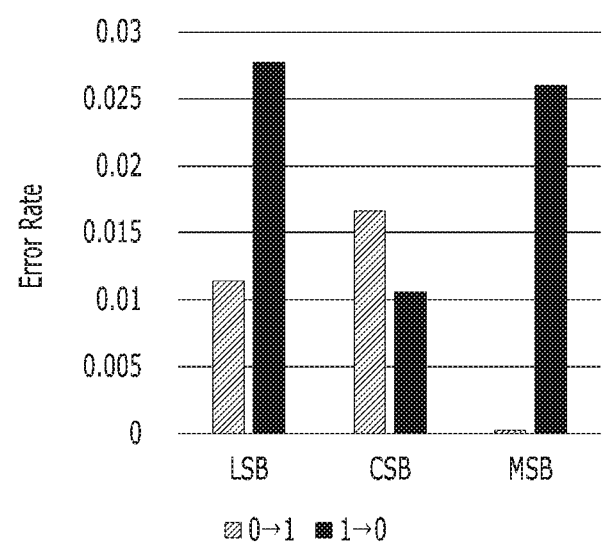
FIG. 5 is a diagram illustrating bit error rates for different pages in a memory device.

FIG. 5 is a diagram illustrating bit error rates for different pages in a memory device, for example, a triple-level cell (TLC) NAND flash memory device. A bit error rate of the NAND flash memory device may typically depend on bit sequences stored in cells of the memory device.

Referring to FIG. 5, pages of the TLC NAND flash memory device may have different bit error rates (or a probability of bit error). On each of the pages, the probability of bit error may be different depending on a value of the bit stored therein. The ratio $r=p_{1\to0}/p_{0\to1}$ is approximately 3, 1 and 100 for the LSB, CSB and MSB pages, respectively. $p_{1\to0}$ may represent bit error rate when a bit having a logical high value (i.e., bit-1) is stored in a corresponding page, $p_{0\to1}$ may represent bit error rate when a bit having a logical low value (i.e., bit-0) is stored in a corresponding page. As such, the MSB page may have a significantly higher bit error rate when bit-1 is stored, compared to when bit-0 is stored. This may be caused by a higher variance of the first state or PV level (i.e., "111") compared to other PV levels. Other pages may have a ratio r that is greater than 1. For example, the LSB page has a ratio r of approximately 3. This may be caused by the use of sub-optimal thresholds for the read operation. In other words, for some pages (e.g., the MSB page), different PV levels have different noise variances which causes the probability of 1→0 errors to be much greater than the probability of 0→1 errors. A 1→0 error occurs when bit-1 is incorrectly read as bit-0, and a 0→1 error occurs when bit-0 is incorrectly read as bit-0. In other words, the ratio r represents a ratio of probabilities: a probability of a stored logical high value "1" being incorrectly read as a logical low value "0" (first probability) to a probability of a stored logical low value "0" being incorrectly read as a logical high value "1" (second probability). Thus, various embodiments provide a scheme to reduce bit error rates in a memory device such as the TLC NAND flash memory device.

Figure 6:
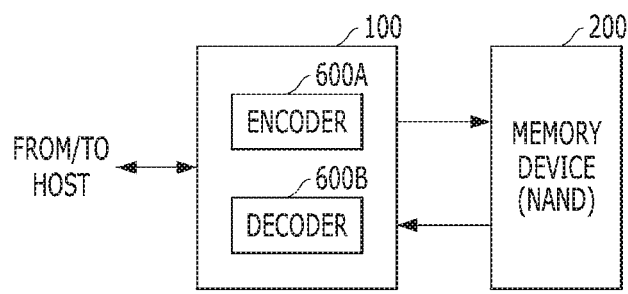
FIG. 6 is a diagram illustrating a memory system in accordance with an embodiment of the present invention.

FIG. 6 is a diagram illustrating a memory system in accordance with an embodiment of the present invention.

Referring to FIG. 6, the memory system may include a controller 100 and a memory device 200. The memory device 200 may include a NAND-type flash memory device with memory cells such as single-level cells (SLCs), multi-level cells (MLCs), triple-level cells (TLCs) or quadruple-level cells (QLCs). In various embodiments, the memory device 200 may include a NAND-type flash memory device with QLC memory cells (i.e., QLCs).

The controller 100 may receive a command from a host, and provide the memory device 200 with the received command. For example, the controller 100 receives a write command and write data corresponding to the write command, and controls the memory device 200 to perform a program operation on the write data. For another example, the controller 100 receives a read command, and controls the memory device 200 to perform a read operation on data corresponding to the read command. The controller 100 transmits read data corresponding to the read command to the host.

The controller 100 may include an encoder 600A, and a decoder 600B. During the program operation, the encoder 600A may perform an encoding operation on the write data based on a set encoding scheme. During the read operation, the decoder 600B may perform a decoding operation on the read data based on a set decoding scheme corresponding to the encoding scheme. The encoding and decoding schemes will be described below with reference to FIGS. 7 to 27. The controller 100 and the memory device 200 may perform the operations described in FIGS. 1 and 2. In an embodiment, the encoder 600A and decoder 600B may be embodied in the ECC component 130 of the controller 100 shown in FIG. 2. Other suitable arrangements may be employed as well, as explained below. In general, the encoder 600A and decoder 600B may be implemented by hardware, software, firmware, or any suitable combination thereof.

In various embodiments, the encoder 600A may perform encoding operations using multiple scrambling (i.e., guided scrambling) in order to reduce the occurrences of a certain value of bit (i.e., a bit having a logical high value "1" or bit-1) before a program operation. That is, the encoder 600A may function as a guided scrambling encoder. The decoder 600B may perform decoding operations using multiple descrambling, corresponding to encoding operations of the encoder 600A.

FIGS. 7 to 18 illustrate encoding and decoding schemes, which are performed by the encoder 600A and the decoder 600B of FIG. 6. In accordance with an embodiment, data bits of a page may be scrambled with multiple random sequences and the number of bit-1's in the scrambled sequences may be counted. The scrambled sequence with the lowest number of bit-1's may be selected among the scrambled sequences as an encoded sequence. The selected scrambled sequence (encoded sequence) may be stored in cells of a memory device, along with indication information for the selected scrambled sequence. For the read operation, the data bits are recovered from the encoded sequence by descrambling the encoded sequence with a corresponding random sequence among the multiple random sequences. The corresponding random sequence is reconstructed using the indication information. The encoding and decoding schemes of FIGS. 7 to 18 are applied to decrease the frequency or number of bit-1's in the encoded sequence when the ratio $r=p_{1\to0}/p_{0\to1}$ (i.e., the ratio of 1→0 errors to 0→1 errors) is greater than a threshold value. Alternatively, similar schemes are applied to increase the frequency or number of bit-1's in the encoded sequence when the ratio $r=p_{1\to0}/p_{0\to1}$ is less than a threshold value. In the latter case, the encoding and decoding schemes of FIGS. 7 to 18 may be modified to select a random sequence among the multiple random sequences that has the highest number of 1's.

Figure 7:
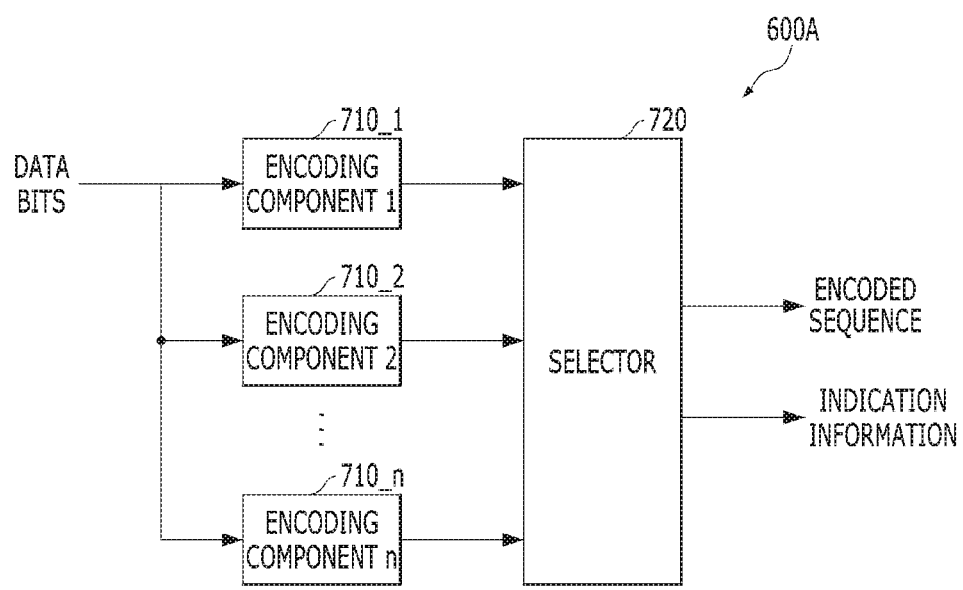
FIG. 7 is a diagram illustrating an encoder in accordance with an embodiment of the present invention.

FIG. 7 is a diagram illustrating an encoder in accordance with an embodiment of the present invention. For example, the encoder of FIG. 7 may depict the encoder 600A shown in FIG. 6.

Referring to FIG. 7, the encoder 600A may include a plurality of encoding components 710_1 to 710_n, and a selector 720. The plurality of encoding components 710_1 to 710_n may include a first encoding component 710_1, a second encoding component 710_2 and an nth encoding component 710_n.

The plurality of encoding components 710_1 to 710_n may scramble data bits corresponding to a select page, using a plurality of random sequences, to generate a plurality of scrambled sequences. The select page may correspond to a logical page, selected from among multiple logical pages. For a memory device having triple-level cells (TLC), an MSB logical page, among multiple logical pages (e.g., MSB, CSB and LSB logical pages), may be selected.

In various embodiments, the plurality of encoding components 710_1 to 710_n may include a plurality of random generators and a plurality of scramblers. Each of the plurality of encoding components 710_1 to 710_n may include a random generator and a scrambler. The plurality of random generators may generate the plurality of random sequences. The plurality of scramblers may scramble the data bits to generate the plurality of scrambled sequences, using the plurality of random sequences. Each of the plurality of scramblers may scramble the data bits, using the corresponding random sequence among the plurality of random sequences.

In various embodiments, each of the plurality of encoding components 710_1 to 710_n may further include a counter for counting a value and outputting a counted value. The counter may count the number of logical high values in a corresponding scrambled sequence and output a corresponding counted value.

The selector 720 may select, as an encoded sequence, a scrambled sequence among the plurality of scrambled sequences. The selected scrambled sequence may be encoded by an additional encoder (e.g., a low density parity check (LDPC) encoder). In various embodiments, the selector 720 may select a scrambled sequence having the lowest number of logical high values "1's" (or b-1's). The selector 720 may provide a memory device (e.g., the memory device 200 of FIG. 5) with the encoded sequence to store the encoded sequence in the triple-level cells of the memory device. Further, the selector 720 may provide the memory device with indication information. The indication information may identify the random sequence from which the selected scrambled sequence was generated.

Figure 8:
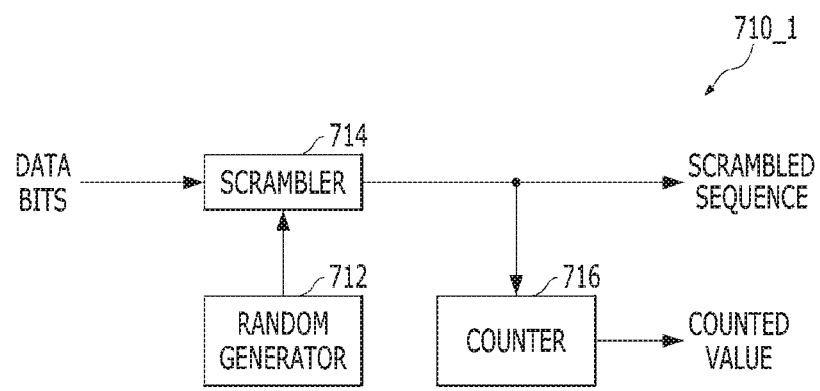
FIG. 8 is a diagram illustrating an encoding component in accordance with an embodiment of the present invention.

FIG. 8 is a diagram illustrating an encoding component 710_1 in accordance with an embodiment of the present invention. For example, the encoding component of FIG. 8 may depict one of the encoding components 710_1 to 710_9 shown in FIG. 7.

Referring to FIG. 8, a representative encoding component 710_1, of the encoding components 710_1 to 710_9, may include a random generator 712, a scrambler 714 and a counter 716. The random generator 712 may generate a random sequence. In various embodiments, the random generator 712 may generate a pseudo random sequence. The scrambler 714 may scramble the data bits to generate a scrambled sequence, using the random sequence. In various embodiments, the scrambler 714 may scramble the data bits by performing an XOR operation on the data bits with the random sequence. The counter 716 may count the number of logical high values in the scrambled sequence to generate a counted value for output.

Figure 9:
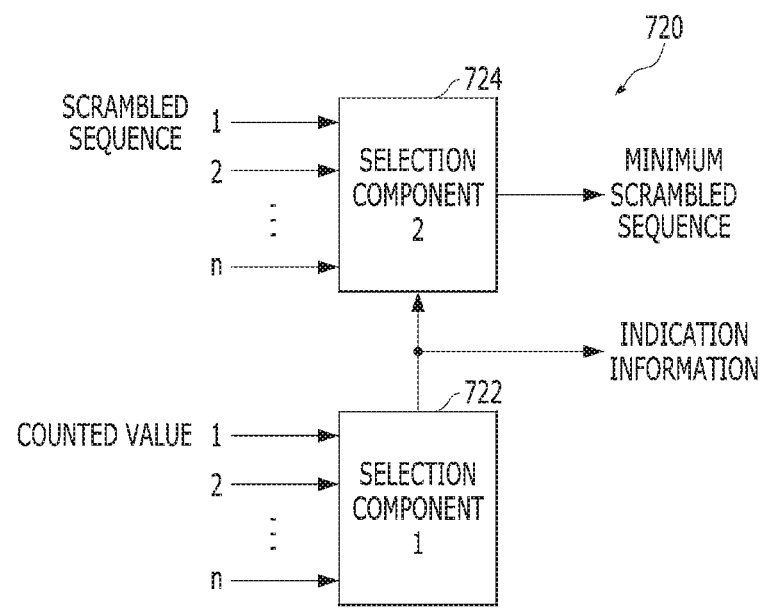
FIG. 9 is a diagram illustrating a selector in accordance with an embodiment of the present invention.

FIG. 9 is a diagram illustrating a selector in accordance with an embodiment of the present invention. For example, the selector of FIG. 9 may depict the selector 720 shown in FIG. 7.

Referring to FIG. 9, the selector 720 may include a first selection component 722 and a second selection component 724.

The first selection component 722 may receive a plurality of (e.g., n) counted values from counters 716 of the encoding components 710_1 to 710_n. The first selection component 722 may select the lowest counted value among the plurality of counted values. The first selection component 722 may output indication information indicating a random sequence among the plurality of random sequences, corresponding to the lowest counted value. The indication information may be transmitted to the memory device 200 of FIG. 6 and the second selection component 724.

The second selection component 724 may receive a plurality of (e.g., n) scrambled sequences from scramblers 714 of the encoding components 710_1 to 710_n in FIGS. 7 and 8. The second selection component 724 may select the scrambled sequence having the lowest number of 1's (minimum scrambled sequence) from among the plurality of scrambled sequences based on the indication information. The selected scrambled sequence as the encoded sequence may be encoded by an encoder such as an LDPC encoder, and then be transmitted to the memory device 200.

Figure 10:
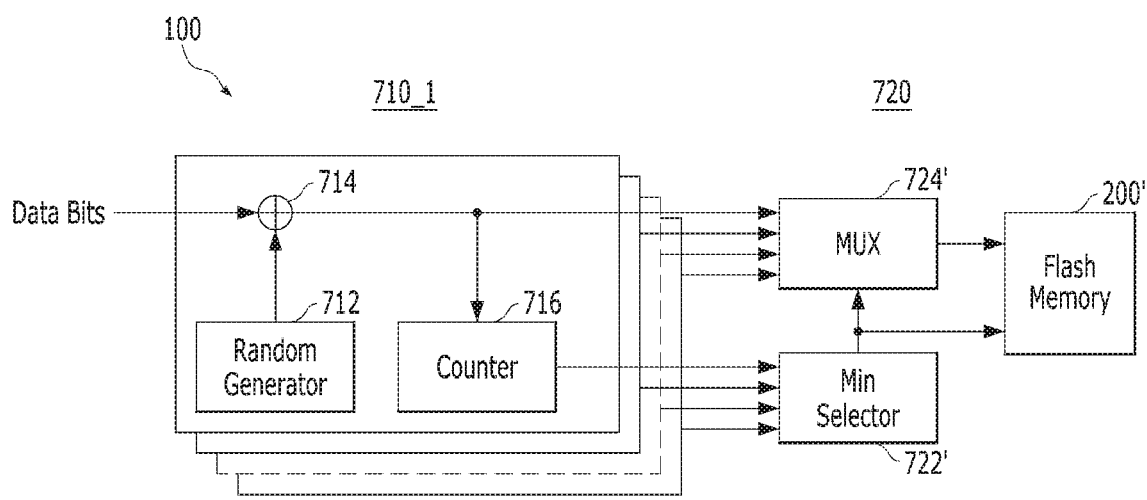
FIG. 10 is a diagram illustrating a memory controller and a memory device in accordance with an embodiment of the present invention.

FIG. 10 is a diagram illustrating a memory controller 100 and a memory device 200 in accordance with an embodiment of the present invention. For example, the memory controller 100 of FIG. 10 may include components shown in FIGS. 7 to 9, and the memory device 200 may be implemented with a flash memory device 200' having multiple level cells such as triple-level cell (TLC).

Referring to FIG. 10, the memory controller 100 may include a plurality of encoding components and a selector 720. Each of the plurality of encoding components 710_1 may include a random generator 712, a scrambler 714 and a counter 716. The selector 720 may include a first selection component 722 and a second selection component 724 as shown in FIG. 9. The first selection component 722 may be implemented with a minimum selector 722' for selecting a lowest value among multiple inputted count values. The second selection component 724 may be implemented with a multiplexer (MUX) 724' for selecting a sequence among multiple scrambled sequences.

The scrambler 714 may scramble (or perform an XOR operation on) data bits for a certain page (e.g., MSB page) with a random sequence to generate a scrambled sequence. Thus, the plurality of scramblers 714 of the plurality of encoding components may generate a plurality of scrambled sequences. The random sequences used by the scramblers 714 may be generated by the random generators 712 of the plurality of encoding components, using different (but deterministic) seeds. The counter 716 may count the number of bit-1's in the corresponding scrambled sequence. The minimum selector 722' may select the minimum count value (i.e., the count value corresponding to the scrambled sequence having the lowest number of 1's) among a plurality of count values. Further, the minimum selector 722' may generate indication information. The indication information may be information (e.g., index or seed) for identifying the random sequence, from which the scrambled sequence having the lowest number of 1's was generated. The indication information may be transmitted to the multiplexer 724'. The multiplexer 724' may select a sequence with a minimum count value (i.e., a sequence having the lowest number of 1's) among the multiple scrambled sequences, based on the indication information. As such, the indication information for a particular scrambled sequence identifies the random sequence from which the particular scrambled sequence was generated. The corresponding scrambled sequence and the indication information may be provided and stored on the certain page of the flash memory device 200'.

In various embodiments, the random sequence generation as well as the scrambling (or XOR) and counting operations may be performed for multiple sequences at the same time to reduce the latency of the encoding process of the encoder 600A in FIG. 6. In other words, the plurality of encoding components may be coupled in parallel, and perform corresponding operations in parallel.

In various embodiments, data bits for the MSB page are encoded using the guided scrambling scheme above. Alternatively, the same scheme may be performed for the LSB and CSB pages if the value of the ratio r is observed to be greater than a certain threshold value (e.g., 1 or 3).

Figure 11:
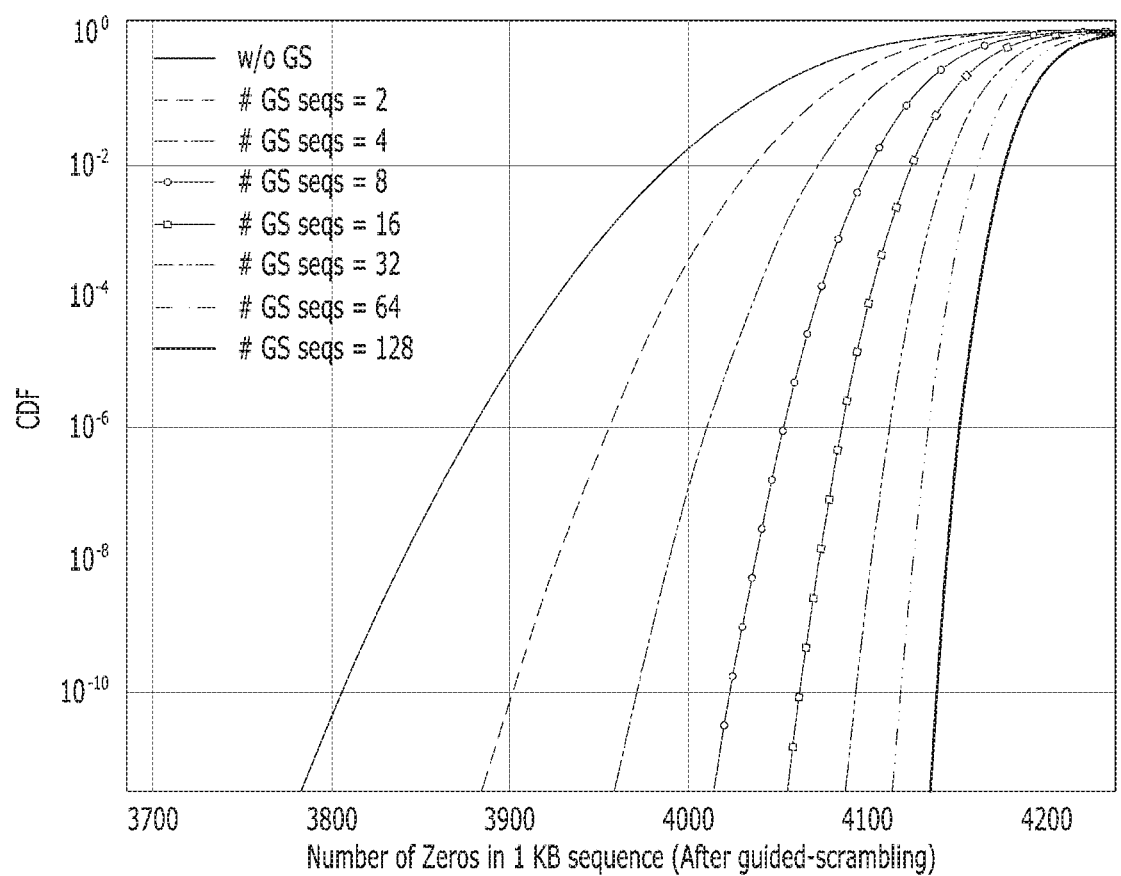
FIG. 11 is a graph illustrating cumulative distribution function of the number of zeros in scrambled sequences in accordance with an embodiment of the present invention.
Figure 12:
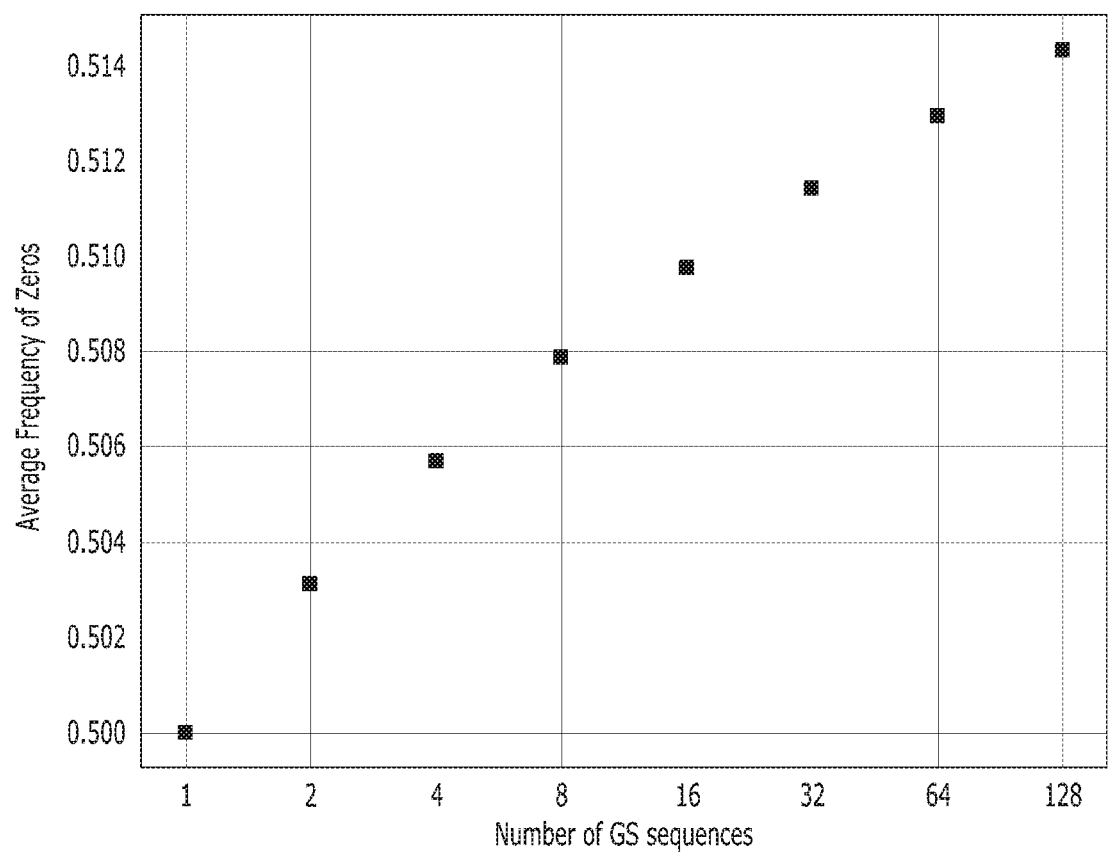
FIG. 12 is a graph illustrating average frequency of zeros in scrambled sequences in accordance with an embodiment of the present invention.

FIG. 11 is a graph illustrating cumulative distribution function (CDF) of the number of zeros in scrambled sequences in accordance with an embodiment of the present invention. FIG. 12 is a graph illustrating average frequency of zeros in scrambled sequences in accordance with an embodiment of the present invention.

Referring to FIGS. 11 and 12, when guided scrambling is performed for various random sequences, CDF and the expected frequency of zeros in a scrambled sequence (e.g., 1 KB sequence) after guided scrambling is illustrated. The number of random sequences may be variable. The frequency or number of bit-1 decreases as the number of sequences increases (e.g., 2→4→8→16→32→64→128). In other words, the frequency or number of bit-0 increases as the number of sequences, but the gains are diminishing. The X-axis is on log-scale in FIG. 12.

Figure 13:
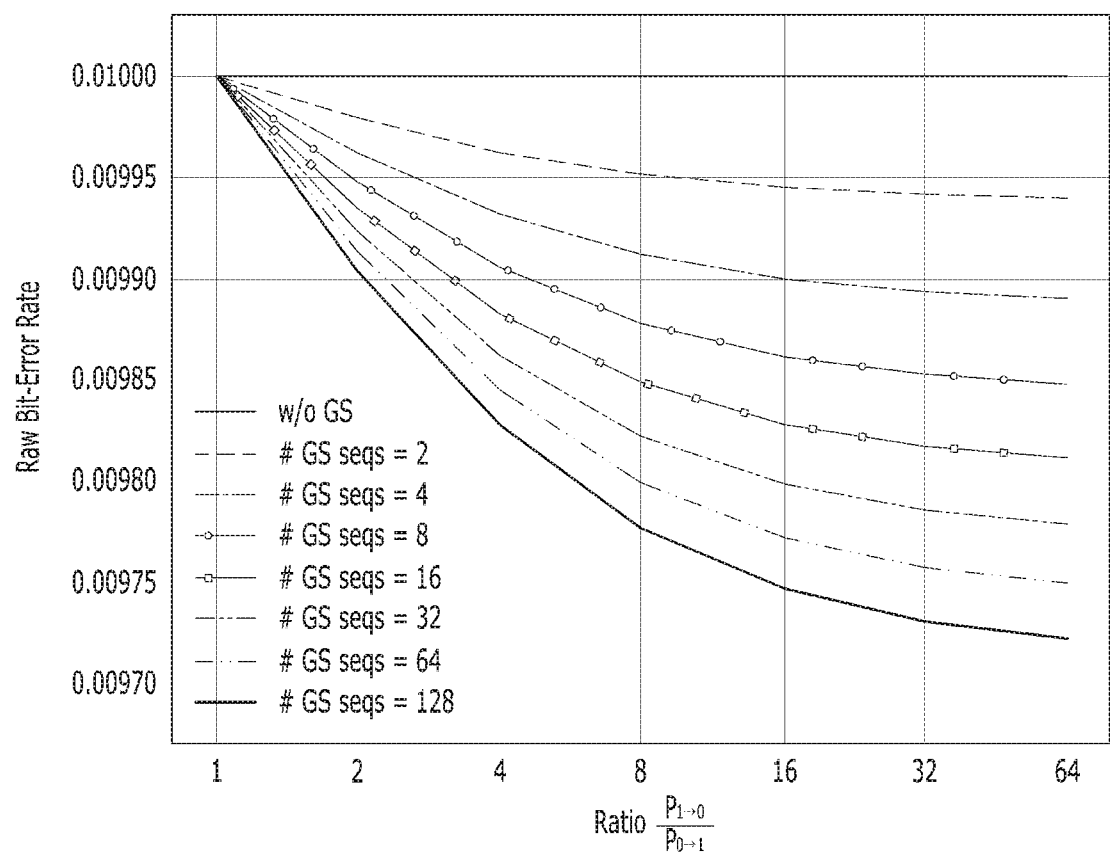
FIG. 13 is a graph illustrating raw bit error rates versus a ratio of 1→0 errors to 0→1 errors for scrambled sequences in accordance with an embodiment of the present invention.
Figure 14:
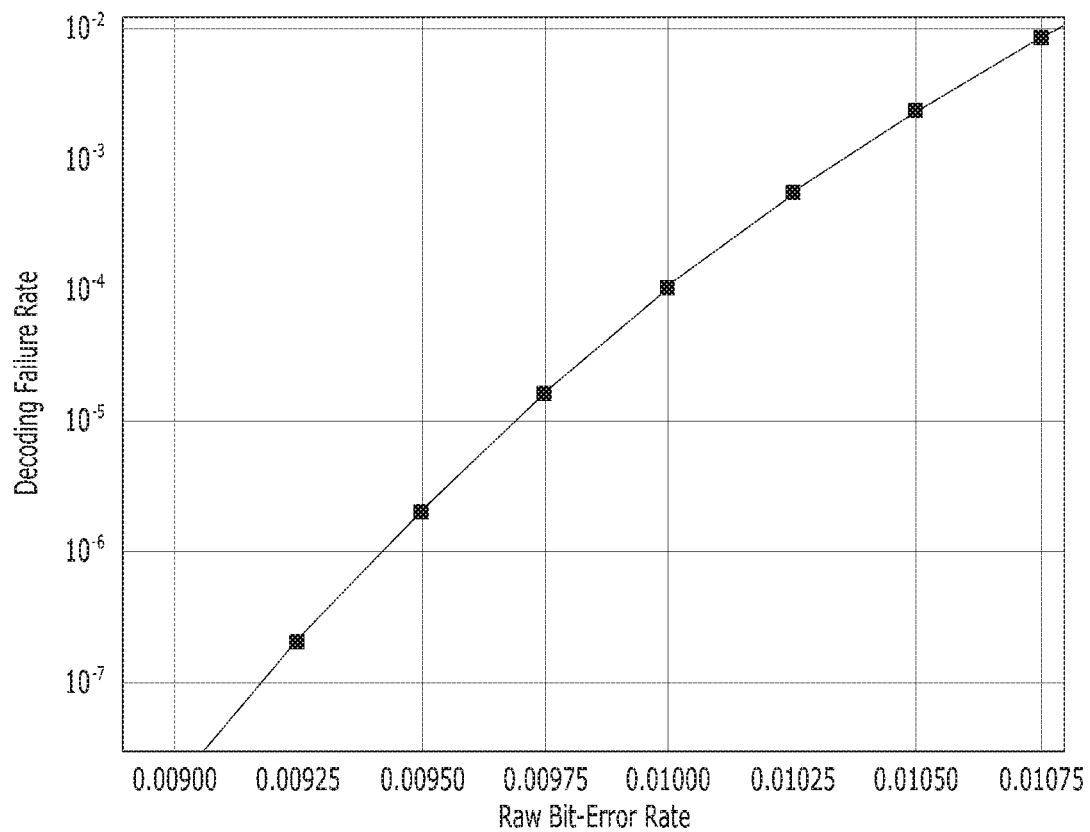
FIG. 14 is a graph illustrating decoding failure rates for an error correction code corresponding to different raw bit error rates in accordance with an embodiment of the present invention.

FIG. 13 is a graph illustrating raw bit error rates versus a ratio of the probability of 1→0 errors (i.e., $p_{1\to 0}$) to the probability of 0→1 errors (i.e., $p_{0\to 1}$) for scrambled sequences in accordance with an embodiment of the present invention. FIG. 14 is a graph illustrating decoding failure rates for an error correction code corresponding to different raw bit error rates in accordance with an embodiment of the present invention.

Referring to FIG. 13, the raw bit error rate after guided-scrambling is shown for a ratio r from 1 to 64, and the number of random sequences considered for guided scrambling varies from 2 to 128. As can be observed, the effective bit error rate decreases as the number of random sequences increases, or as the ratio r increases. In the best case, the raw bit error rate is reduced from 0.01 to 0.009725, i.e., by a factor of about 10. The reduced bit error rate implies that the decoding failure rate is reduced by this factor, as shown in the FIG. 14.

Figure 15:
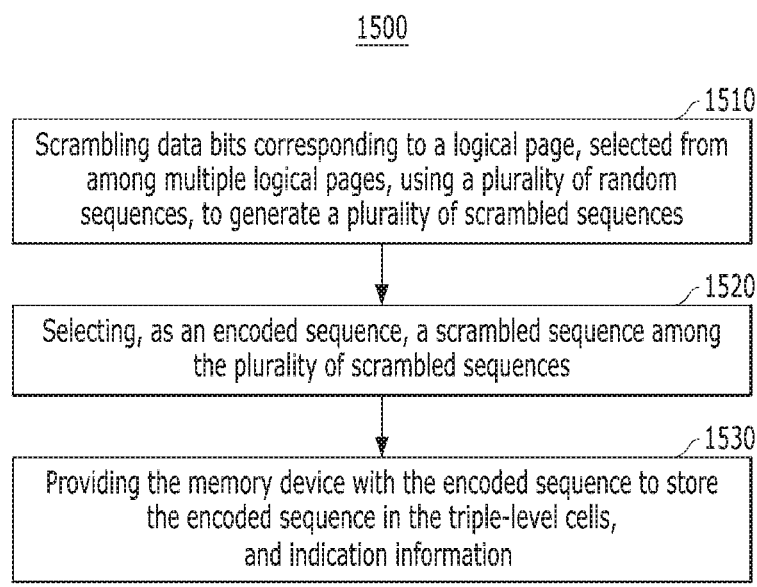
FIG. 15 is a flowchart illustrating an operation of an encoder in accordance with an embodiment of the present invention.

FIG. 15 is a flowchart illustrating an encoding operation 1500 of an encoder in accordance with an embodiment of the present invention. For example, the operation of FIG. 15 may be performed by the memory controller 100 including the encoder 600A of FIGS. 6 to 10. The memory controller 100 may control the memory device 200 including memory cells such as triple-level cells (TLCs) to perform a program operation on the memory cells.

Referring to FIG. 15, the encoding operation 1500 may include operations 1510, 1520 and 1530. The operation 1510 may include scrambling data bits corresponding to a logical page, selected from among multiple logical pages, using a plurality of random sequences, to generate a plurality of scrambled sequences.

In various embodiments, the operation 1510 may include generating, by a plurality of random generators, the plurality of random sequences. Operation 1510 may further include scrambling the data bits using the plurality of random sequences to generate the plurality of scrambled sequences. The scrambling may be performed by a plurality of scramblers. In various embodiments, each of the plurality of scramblers may scramble the data bits by performing an XOR operation on the data bits with a corresponding random sequence to generate a corresponding scrambled sequence.

In various embodiments, the multiple logical pages may include a most significant bit (MSB) page, a center significant bit (CSB) page and a least significant bit (LSB) page. In an embodiment, the selected logical page may include the MSB page. Alternatively, the selected logical page may include a logical page having a ratio of a first probability to a second probability that is greater than a threshold value, the first probability indicating a probability of a logical high value stored in the memory device being incorrectly read as a logical low value, and the second probability indicating a probability of a logical low value stored in the memory device being incorrectly read as a logical high value.

The operation 1520 may include selecting, as an encoded sequence, a scrambled sequence among the plurality of scrambled sequences. The scrambled sequence may be additionally encoded and be outputted as the encoded sequence.

In various embodiments, the selected scrambled sequence may correspond to a scrambled sequence having the lowest number of logical high values (minimum scrambled sequence), among the plurality of scrambled sequences.

In various embodiments, the operation 1520 may be performed by a selector for performing the selecting operation.

In various embodiments, the operation 1520 may include counting the number of logical high values in the plurality of scrambled sequences and outputting the counted values. The counting may be performed by a plurality of counters.

In various embodiments, the operation 1520 may include, by a first selection component, receiving the plurality of counted values, selecting the lowest counted value, and transmitting the selected count value to a second selection component. Further, the operation 1520 may include, by the second selection component, receiving the plurality of scrambled sequences, and selecting the minimum scrambled sequence among the plurality of scrambled sequences corresponding to the selected count value. The selected scrambled sequence may be additionally encoded.

The operation 1530 may include providing the memory device 200 with the encoded sequence to store the encoded sequence in the triple-level cells.

In various embodiments, the operation 1530 may include, by the first selection component, outputting indication information to the memory device. The indication information may indicate which random sequence among the plurality of random sequences corresponds to the lowest counted value. Further, the operation 1530 may include, by the second selection component, outputting, to the memory device, the minimum scrambled sequence as the encoded sequence.

Figure 16:
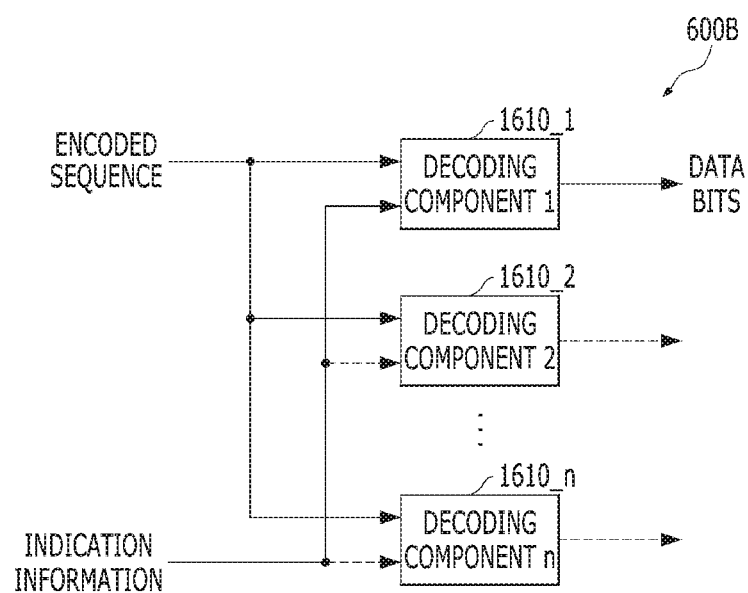
FIG. 16 is a diagram illustrating a decoder in accordance with an embodiment of the present invention.

FIG. 16 is a diagram illustrating a decoder in accordance with an embodiment of the present invention. For example, the decoder of FIG. 16 may depict the decoder 600B shown in FIG. 6.

Referring to FIG. 16, the decoder 600B may receive an encoded sequence from a memory device (e.g., the memory device 200 of FIG. 6) and recover data bits in the encoded sequence. In various embodiments, the memory device may include multiple level cells such as triple-level cells (TLCs), in which the encoded sequence is stored. The data bits may correspond to bits of a logical page, selected from among multiple logical pages corresponding to the multi-level cells.

The decoder 600B may include a plurality of decoding components 1610_1 to 1610_n. The plurality of decoding components 1610_1 to 1610_n may include a first decoding component 1610_1, a second decoding component 1610_2 and an nth decoding component 1610_n.

Each of plurality of decoding components 1610_1 to 1610_n may receive, from the memory device 200, the encoded sequence and indication information. Each of the plurality of decoding components 1610_1 to 1610_n is capable of generating a random sequence. In various embodiments, using the indication information, a random sequence to be generated corresponding to a scrambled sequence having the lowest number of logical high values, among a plurality of scrambled sequences may be determined.

One of the plurality of decoding components 1610_1 to 1610_n may be selected based on the indication information.

For example, the first decoding component 1610_1 may be selected. The selected decoding component 1610_1 may then generate the random sequence identified by the indication information. The selected decoding component 1610_1 may descramble the encoded sequence using the random sequence it just generated to generate a descrambled sequence. The generated descrambled sequence may include the data bits corresponding to the logical page, previously selected from among the multiple logical pages. As previously described, in a memory device having triple-level cells (TLC), a logical page (e.g., MSB page), among multiple logical pages (e.g., MSB, CSB and LSB pages) may have been selected as the logical page.

Figure 17:
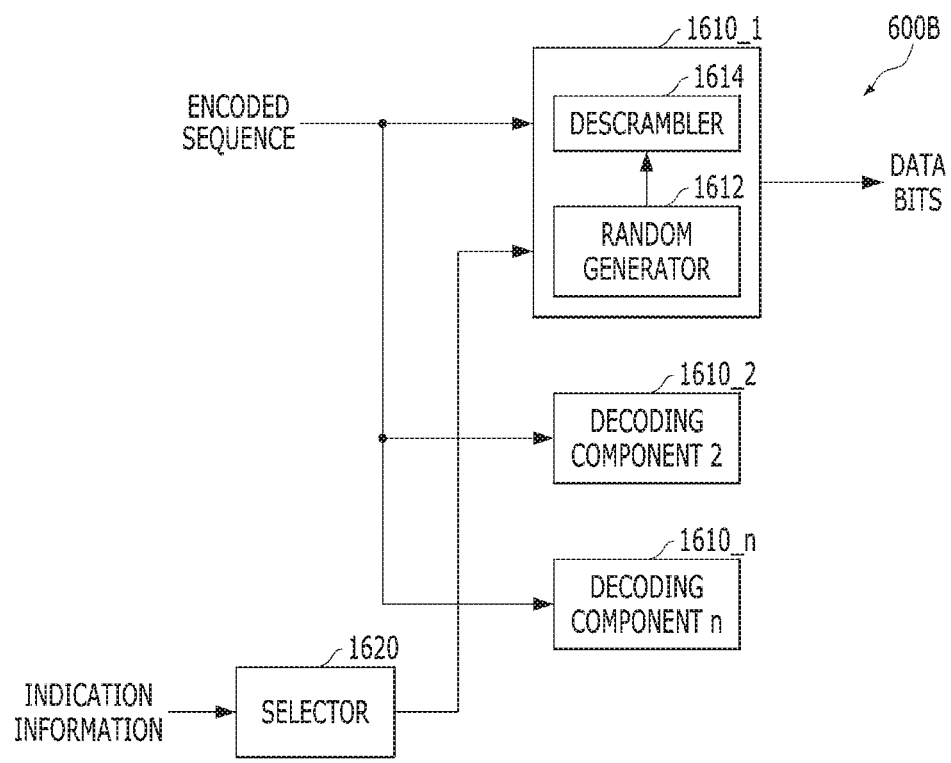
FIG. 17 is a diagram illustrating a decoding component in accordance with an embodiment of the present invention.

FIG. 17 is a diagram illustrating a decoding component of a decoder in accordance with an embodiment of the present invention. For example, the decoding component of FIG. 17 may depict the first decoding component 1610_1 among the decoding components 1610_1 to 1610_n of the decoder 600B shown in FIG. 16. Each of the remaining decoding components 1610_2 to 1610_n may be identical to the first decoding component 1610_1.

Referring to FIG. 17, the decoder 600B may include the plurality of decoding components 1610_1 to 1610_n as shown in FIG. 16 and may further include a selector 1620. The plurality of decoding components 1610_1 to 1610_n may receive, from the memory device 200, the encoded sequence.

The selector 1620 may receive indication information from the memory device 200 of FIG. 6.

The selector 1620 may select or enable one of the plurality of decoding components 1610_1 to 1610_n based on the indication information. For example, the first decoding component 1610_1 may be selected or enabled among the plurality of decoding components 1610_1 to 1610_n.

The first decoding component 1610_1 may include a random generator 1612 and a descrambler 1614. The random generator 1612 may generate a random sequence such as a pseudo random sequence. The descrambler 1614 may descramble the encoded sequence to generate a descrambled sequence, using the random sequence. In various embodiments, the descrambler 1614 may descramble the encoded sequence by performing an XOR operation on the encoded sequence with the random sequence. The descrambled sequence may include the data bits corresponding to a certain logical page, selected from among the multiple logical pages. The descrambled sequence may be additionally decoded by a decoder such as a low density parity check (LDPC) decoder.

Figure 18:
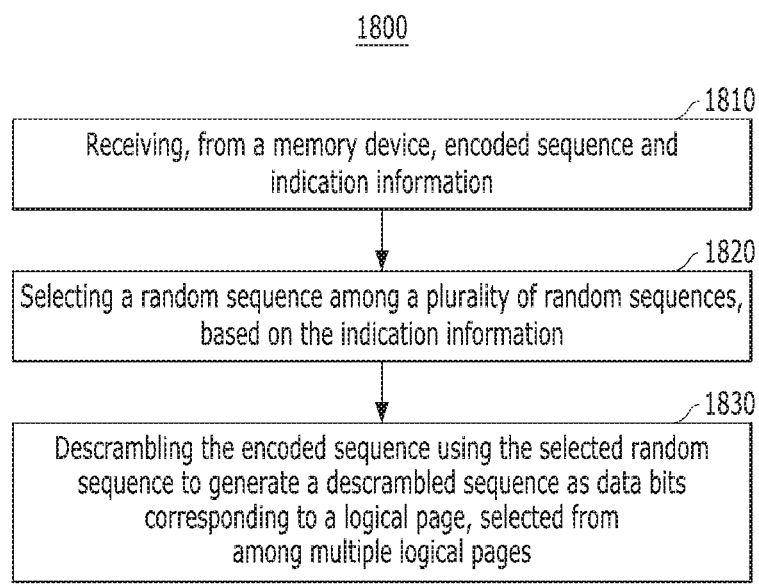
FIG. 18 is a flowchart illustrating an operation of a decoder in accordance with an embodiment of the present invention.

FIG. 18 is a flowchart illustrating a decoding operation 1800 of a decoder in accordance with an embodiment of the present invention. For example, the operation of FIG. 18 may be performed by the memory controller 100 including the decoder 600B of FIGS. 6, 16 and 17. The memory controller 100 may control the memory device 200 including memory cells such as triple-level cells (TLCs) to perform a read operation on the memory cells.

Referring to FIG. 18, the decoding operation 1800 may include operations 1810, 1820 and 1830. The operation 1810 may include receiving, from the memory device 200, encoded sequence and indication information. The operation 1820 may include selecting a random sequence among a plurality of random sequences, based on the indication information.

In various embodiments, the indication information may indicate the random sequence corresponding to a scrambled sequence having a lowest number of logical high values, among a plurality of scrambled sequences. The plurality of scrambled sequences is generated by scrambling the data bits using the plurality of random sequences.

The operation 1830 may include descrambling the encoded sequence using the selected random sequence to generate a descrambled sequence. The descrambled sequence may include data bits corresponding to a logical page, selected from among multiple logical pages.

In various embodiments, the operation 1830 may include descrambling the encoded sequence using a corresponding random sequence, based on the indication information. The corresponding random sequence may be generated by a random generator, selected from among a plurality of random generators.

In various embodiments, the operation 1830 may include descrambling the encoded sequence by performing an XOR operation on the encoded sequence with the selected random sequence.

In various embodiments, the multiple logical pages may include a most significant bit (MSB) page, a center significant bit (CSB) page and a least significant bit (LSB) page. In various embodiments, the selected logical page may include the MSB page. Alternatively, the selected logical page may include a logical page having a ratio of a first probability to a second probability that is greater than a threshold value, the first probability indicating a probability of a logical high value stored in the memory device read incorrectly as a logical low value, and the second probability indicating a probability of the logical low value stored in the memory device read incorrectly as the logical high value.

As described above in connection with FIGS. 7 to 18, the encoding and decoding schemes require storing of indication information (or extra bits) to indicate which scrambled sequence (or random sequence) was used at the encoder 600A. Thus, these schemes may increase a rate of an error correction code such as a low density parity check (LDPC) code. Moreover, when guided scrambling is only used for a certain page (e.g., MSB page), the MSB page requires a LDPC code having a rate that is different from those of the LSB and the CSB pages. This implies higher hardware cost to implement decoders for multiple code rates. Therefore, it is desirable to allow the use of guided scrambling without requiring extra bits to be stored.

FIGS. 19 to 27 illustrate encoding and decoding schemes, which will be performed by the encoder 600A and the decoder 600B of FIG. 6. In accordance with an embodiment, a guided scrambling encoder may be coupled between a cyclic redundancy check (CRC) encoder and a low density parity check (LDPC) encoder. Indication information for the selected scrambled sequence may be not stored in the corresponding page of the memory device. To recover data bits, the indication information may be recovered with the aid of the CRC parity bits. At the decoder, all candidate random sequences may be tested in parallel. The random sequence corresponding to the CRC syndrome having all zeros may be selected to recover the data bits.

Figure 19:
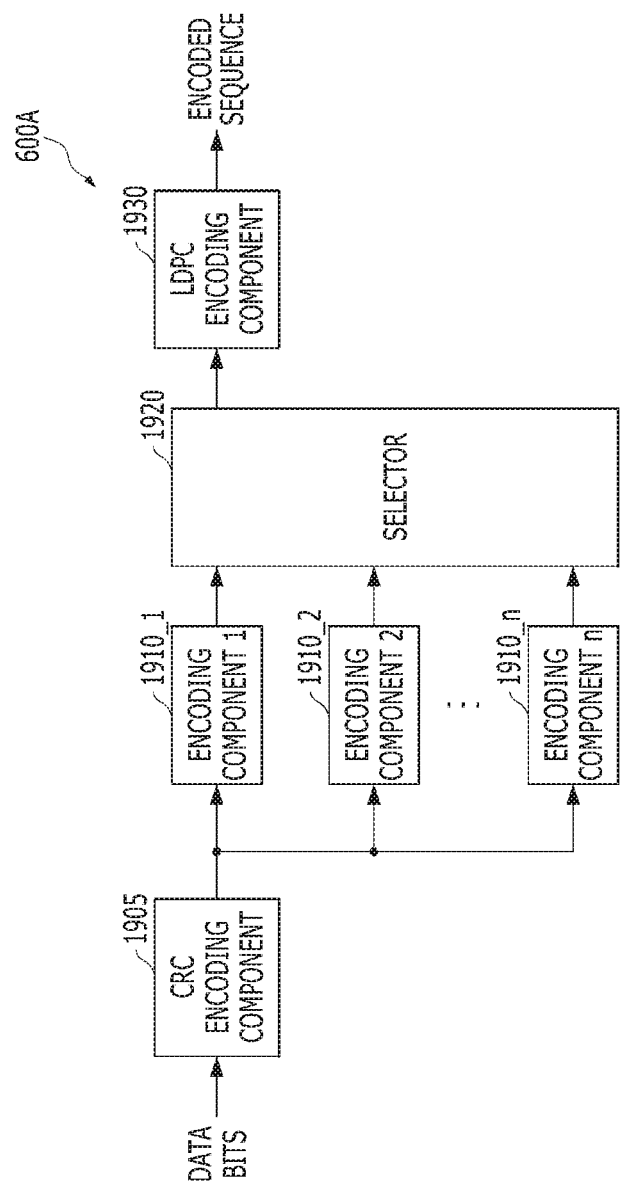
FIG. 19 is a diagram illustrating an encoder in accordance with an embodiment of the present invention.

FIG. 19 is a diagram illustrating an encoder in accordance with an embodiment of the present invention. For example, the encoder of FIG. 19 may depict the encoder 600A shown in FIG. 6.

Referring to FIG. 19, the encoder 600A may include a plurality of encoding components 1910_1 to 1910_n and a selector 1920, in similar to the encoder 600A in FIG. 7. The plurality of encoding components 1910_1 to 1910_n may include a first encoding component 1910_1, a second encoding component 1910_2 and an nth encoding component 1910_n. Further, the encoder 600A may include a cyclic redundancy check (CRC) encoding component 1905 and a low density parity check (LDPC) encoding component 1930.

The CRC encoding component 1905 may encode data bits using a cyclic redundancy check (CRC) code. The CRC encoding component 1905 may output the encoded data bits to the plurality of encoding components 1910_1 to 1910_n.

The plurality of encoding components 1910_1 to 1910_n may receive the encoded data bits from the CRC encoding component 1905 and scramble the encoded data bits to generate a plurality of scrambled sequences. The encoded data bits may correspond to a certain logical page, selected from among multiple logical pages. For a memory device having triple-level cells (TLC), among multiple logical pages (e.g., MSB, CSB and LSB pages of FIG. 4B), the MSB page may be selected.

In various embodiments, the plurality of encoding components 1910_1 to 1910_n may include a plurality of random generators and a plurality of scramblers. Each of the plurality of encoding components 1910_1 to 1910_n may include a random generator and a scrambler, similar to the encoding component 710 in FIG. 8. The plurality of random generators may generate the plurality of random sequences. The plurality of scramblers may scramble the data bits to generate the plurality of scrambled sequences, using the plurality of random sequences. Each of the plurality of scramblers may scramble the encoded data bits, using the corresponding random sequence.

In various embodiments, the plurality of encoding components 1910_1 to 1910_n may further include a plurality of counters for outputting a plurality of counted values. In other words, each of the plurality of encoding components 1910_1 to 1910_n may include a corresponding counter, similar to the encoding component 710 in FIG. 8. Each of the plurality of counters may count the number of the logical high values in a corresponding scrambled sequence and output a corresponding counted value.

The selector 1920 may select, as an encoded sequence, one of the plurality of scrambled sequences. In various embodiments, the selector 1920 may select, as the encoded sequence, a minimum scrambled sequence, i.e., a scrambled sequence having the lowest number of logical high values "1" (or b-1) among the plurality of scrambled sequences.

The LDPC encoding component 1930 may receive the encoded sequence from the selector 1920. The LDPC encoding component 1930 may encode the encoded sequence using a low density parity check (LDPC) code. The LDPC encoding component 1930 may provide a memory device (e.g., the memory device 200 of FIG. 5) with the LDPC encoded sequence to store the LDPC encoded sequence in the triple-level cells of the memory device.

Figure 20:
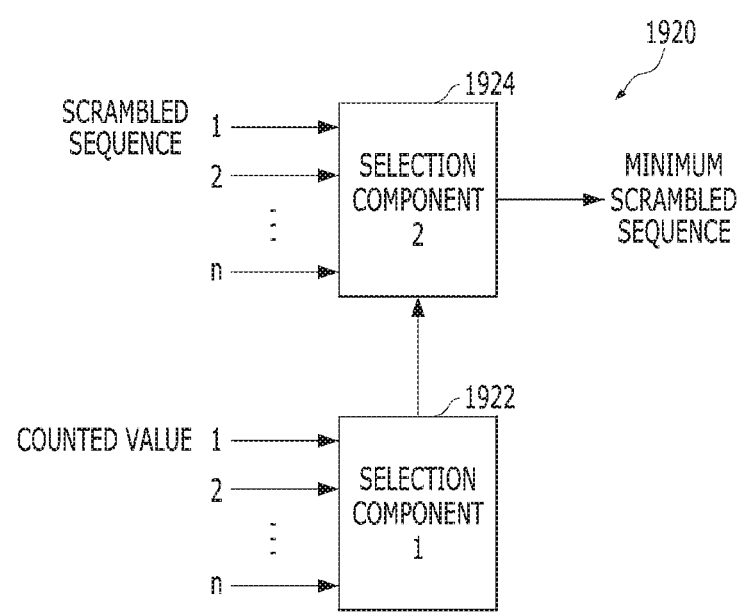
FIG. 20 is a diagram illustrating a selector in accordance with an embodiment of the present invention.

FIG. 20 is a diagram illustrating a selector 1920 in accordance with an embodiment of the present invention. For example, the selector of FIG. 20 may depict the selector 1920 shown in FIG. 7.

Referring to FIG. 20, the selector 1920 may include a first selection component 1922 and a second selection component 1924.

The first selection component 1922 may receive a plurality of (e.g., n) counted values from counters of the encoding components 1910_1 to 1910_n in FIG. 19. The first selection component 1922 may select the lowest counted value among the plurality of counted values. Further, the first selection component 1922 may generate indication information. The indication information may be information (e.g., index or seed) for identifying the random sequence, from which the scrambled sequence having the lowest number of 1's was generated. The first selection component 1922 may output the indication information to the second selection component 1924.

The second selection component 1924 may receive a plurality of (e.g., n) scrambled sequences from scramblers of the encoding components 1910_1 to 1910_n in FIG. 19 and select therefrom the minimum scrambled sequence based on the indication information. The second selection component 1924 may output, to the memory device 200, the minimum scrambled sequence as the encoded sequence. The minimum scrambled sequence may be the sequence having the lowest number of logical high values.

Figure 21:
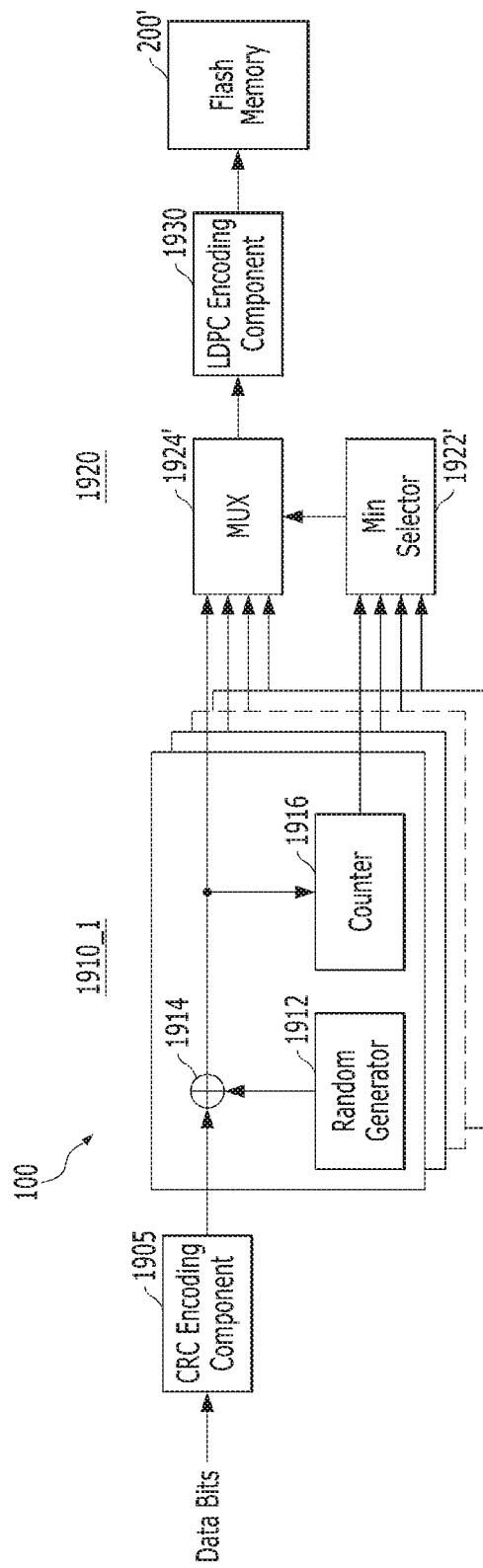
FIG. 21 is a diagram illustrating a memory controller and a memory device in accordance with an embodiment of the present invention.

FIG. 21 is a diagram illustrating a memory controller 100 and a memory device 200 in accordance with an embodiment of the present invention. For example, the memory controller 100 of FIG. 21 may include components shown in FIGS. 19 to 20, and the memory device 200 may be implemented with a flash memory device 200' having multiple level cells such as triple-level cell (TLC).

Referring to FIG. 21, the memory controller 100 may include a cyclic redundancy check (CRC) encoder 1905, a plurality of encoding components, a selector 1920 and a low density parity check (LDPC) encoder 1930. Each of the plurality of encoding components 1910_1 may include a random generator 1912, a scrambler 1914 and a counter 1916. The selector 1920 may include a first selection component 1922 and a second selection component 1924 as shown in FIG. 20. The first selection component 1922 may be implemented with a minimum selector 1922' for selecting minimum, e.g., lowest, value among multiple input values. The second selection component 1924 may be implemented with a multiplexer (MUX) 1924' for selecting one of the multiple input sequences.

The CRC encoding component 1905 may encode data bits using a cyclic redundancy check (CRC) code. The CRC encoding component 1905 may output the encoded data bits to the plurality of encoding components 1910_1 to 1910_n.

The scrambler 1914 may scramble (or perform an XOR operation on) data bits for a certain page (e.g., MSB page) with multiple random sequences, to generate multiple scrambled sequences. The random sequences may be generated by the random generator 1912, using different (but deterministic) seeds. The counter 1916 may count the number of bit-1's in each of the multiple scrambled sequences. The minimum selector 1922' may select the minimum count value (i.e., lowest count of 1's) as indication information. The multiplexer 1924' may select the sequence corresponding to the minimum or lowest count value based on the indication information. Indication information (e.g., index or seed) may be used to determine the random sequence corresponding to the selected scrambled sequence.

The LDPC encoding component 1930 may receive the encoded sequence from the selector 1920. The LDPC encoding component 1930 may encode the encoded sequence using a low density parity check (LDPC) code. The LDPC encoding component 1930 may provide the LDPC encoded sequence to the flash memory device 200' to store the LDPC encoded sequence in the triple-level cells of the memory device.

Since the minimum distance of LDPC codes is typically not as large as other codes like Bose Chaudhri Hocquenghem (BCH) or Reed Solomon (RS) codes, the LDPC codes are used in concatenation with CRC codes. This allows detection of situations in which the LDPC decoder causes mis-correction, i.e., converges to a codeword that is different from the transmitted codeword. In accordance with the encoding scheme of FIG. 21, the CRC code is also used for another purpose, i.e., for determining the corresponding sequence from a set of candidate sequences when guided scrambling is used.

In FIG. 21, data bits may be padded with the CRC parity bits by the CRC encoding component 1905 to generate encoded data bits (i.e., CRC codeword). Next, by the plurality of encoding components 1910_1 to 1910_n and the selector 1920, the guided scrambling is performed by scrambling (e.g., performing an XOR operation on) the CRC codeword with the candidate random sequences and selecting a scrambled sequence having the lowest number of 1's. Typically, indication information (or index) for the selected scrambled sequence would be padded to the scrambled CRC codeword. However, in accordance with the encoding scheme, the indication information is not provided and stored to the memory device 200. Finally, the LDPC encoding component 1930 is used to determine the LDPC parity bits and the LDPC codeword is stored on cells of the flash memory device 200'.

For some pages (e.g., CSB and LSB pages), the guided scrambling may not be used. In both cases, the input to the LDPC encoding component 1930 has the same length and therefore the same LDPC code may be used.

Figure 22:
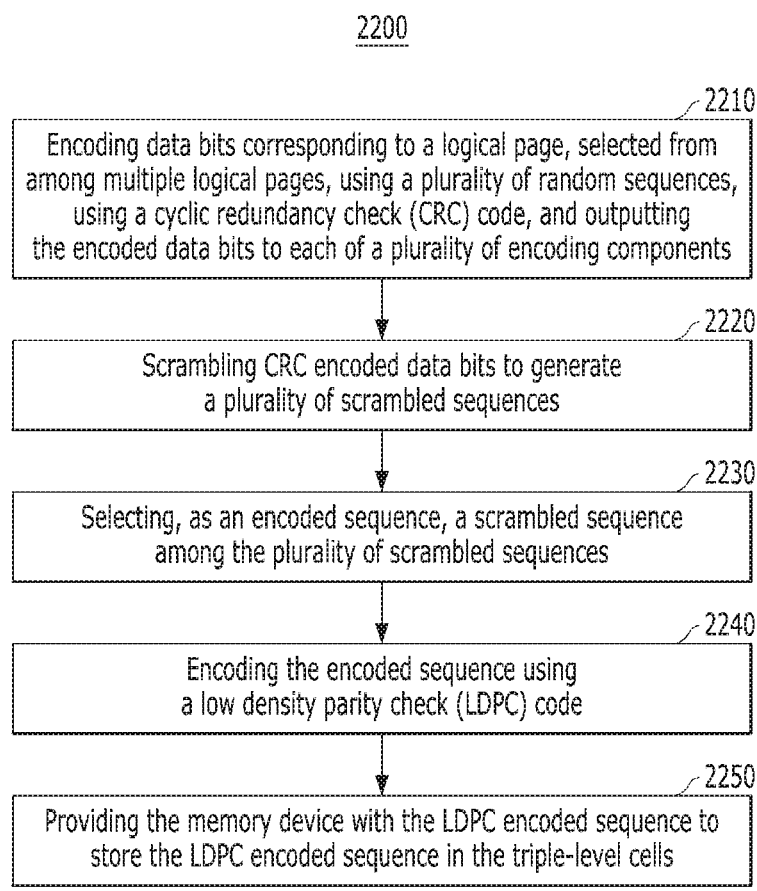
FIG. 22 is a flowchart illustrating an operation of an encoder in accordance with an embodiment of the present invention.

FIG. 22 is a flowchart illustrating an operation 2200 of an encoder in accordance with an embodiment of the present invention. For example, the operation of FIG. 22 may be performed by the memory controller 100 including the encoder 600A of FIGS. 6 and 19 to 21. The memory controller 100 may control the memory device 200 including memory cells such as triple-level cells (TLCs) to perform a program operation on the memory cells.

Referring to FIG. 22, the encoding operation 2200 may include operations 2210, 2220, 2230, 2240 and 2250. The operation 2210 may include encoding the data bits using a cyclic redundancy check (CRC) code, and outputting the encoded data bits to each of the plurality of encoding components.

The operation 2220 may include scrambling encoded data bits corresponding to a logical page, selected from among multiple logical pages, using a plurality of random sequences, to generate a plurality of scrambled sequences.

In various embodiments, the operation 2220 may include generating, by a plurality of random sequences, the plurality of random sequences, and scrambling, by a plurality of scramblers, the encoded data bits to generate the plurality of scrambled sequences, using the plurality of random sequences. In various embodiments, each of the plurality of scramblers may scramble the encoded data bits by performing an XOR operation on the data bits with a corresponding random sequence.

In various embodiments, the multiple logical pages may include a most significant bit (MSB) page, a center significant bit (CSB) page and a least significant bit (LSB) page. In an embodiment, the selected logical page may include the MSB page. Alternatively, the selected logical page may include a logical page having a ratio of a probability of a logical high value stored in the memory device read incorrectly as a logical low value (first probability) to a probability of a logical low value stored in the memory device read incorrectly as a logical high value (second probability) that is greater than a threshold value.

The operation 2230 may include selecting, as an encoded sequence, a scrambled sequence among the plurality of scrambled sequences.

In various embodiments, the selected scrambled sequence may have the lowest number of logical high values, among the plurality of scrambled sequences.

In various embodiments, the operation 2230 may include selecting, as the encoded sequence, a minimum scrambled sequence among the plurality of scrambled sequences. The selecting may be performed by a selector.

In various embodiments, the minimum scrambled sequence may have the lowest number of logical high values, among the plurality of scrambled sequences.

In various embodiments, the operation 2230 may include counting and outputting a plurality of counted values. Each of the plurality of counters may count the number of logical high values in a corresponding scrambled sequence and output the corresponding counted value. The counting and outputting may be performed by a plurality of counters.

In various embodiments, the operation 2230 may include receiving the plurality of counted values and selecting the lowest counted value among the plurality of counted values. Further, the operation 2230 may include receiving the plurality of scrambled sequences, and selecting the minimum scrambled sequence among the plurality of scrambled sequences based on the indication information. The selection of the lowest counted value may be performed by a first selection component, and the selection of the minimum scrambled sequence may be performed by a second selection component.

The operation 2240 may include receiving the encoded sequence, encoding the encoded sequence using a low density parity check (LDPC) code and outputting an LDPC encoded sequence.

The operation 2250 may include providing the memory device 200 with the LDPC encoded sequence to store the encoded sequence in the triple-level cells.

Figure 23:
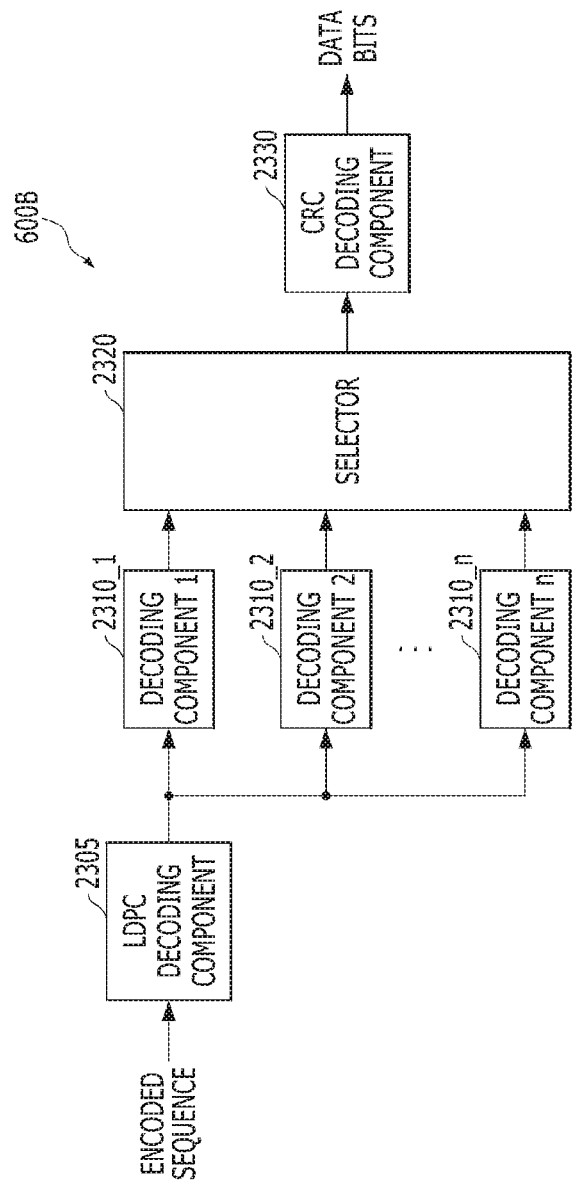
FIG. 23 is a diagram illustrating a decoder in accordance with an embodiment of the present invention.

FIG. 23 is a diagram illustrating a decoder in accordance with an embodiment of the present invention. For example, the decoder of FIG. 23 may depict the decoder 600B shown in FIG. 6.

Referring to FIG. 23, the decoder 600B may include a low density parity check (LDPC) decoding component 2305, a plurality (e.g., n) of decoding components 2310_1 to 2310_n, a selector 2320 and a cyclic redundancy check (CRC) decoding component 2330. The plurality of decoding components 2310_1 to 2310_n may include a first decoding component 2310_1, a second decoding component 2310_2 and an nth decoding component 2310_n.

The LDPC decoding component 2305 may receive, from the memory device, the encoded sequence, and decode the encoded sequence using a low density parity check (LDPC) code to generate an LDPC decoded sequence.

The plurality of decoding components 2310_1 to 2310_n may descramble the LDPC decoded sequence using a plurality of random sequences, to generate a plurality of descrambled sequences.

In various embodiments, the plurality of decoding components 2310_1 to 2310_n may include a plurality of random generators and a plurality of descramblers. Each of the plurality of decoding components 2310_1 to 2310_n may include a random generator and a descrambler. The plurality of random generators may generate the plurality of random sequences. The plurality of descramblers may descramble the LDPC decoded sequence to generate the plurality of descrambled sequences, using the plurality of random sequences. Each of the plurality of descramblers may descramble the LDPC decoded sequence, using the corresponding random sequence among the plurality of random sequences.

In various embodiments, the plurality of decoding components 2310_1 to 2310_n may further include a plurality of calculators suitable for calculating the CRC syndromes of the plurality of descrambled sequences. In other words, each of the plurality of encoding components 2310_1 to 2310_n may include a corresponding calculator among the plurality of calculators. Each of the plurality of calculators may calculate a corresponding CRC syndrome among the CRC syndromes, to output a corresponding CRC syndrome value.

The selector 2320 may select a descrambled sequence to be recovered, among the plurality of descrambled sequences. In various embodiments, the selector 2320 may select the descrambled sequence to be recovered, among the plurality of descrambled sequences, based on cyclic redundancy check (CRC) syndromes of the plurality of descrambled sequences. The selected descrambled sequence may be recovered. The recovered sequence may include data bits corresponding to a logical page, selected from among multiple logical pages, and CRC parity bits.

In various embodiments, the selected descrambled sequence corresponds to a scrambled sequence having a minimum number of a logical high value "1" (or bit-1), among a plurality of scrambled sequences, which is generated by scrambling the data bits using the plurality of random sequences.

The CRC decoding component 2330 may receive the recovered sequence from the selector 2320, perform a decoding operation using a CRC code to generate the data bits.

Figure 24:
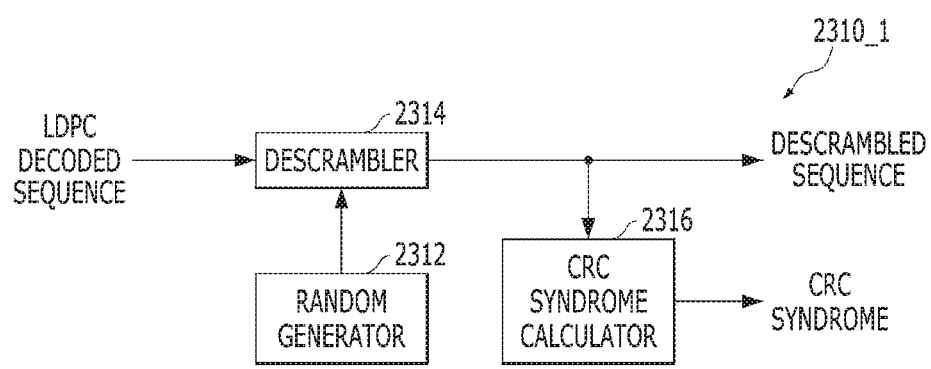
FIG. 24 is a diagram illustrating a decoding component in accordance with an embodiment of the present invention.

FIG. 24 is a diagram illustrating a decoding component 2310_1 in accordance with an embodiment of the present invention. For example, the decoding component of FIG. 24 may depict one of the decoding components 2310_1 to 2310_n shown in FIG. 23.

Referring to FIG. 24, the decoding component 2310_1 may include a random generator 2312, a descrambler 2314 and a CRC syndrome calculator 2316. The random generator 2312 may generate a random sequence. In various embodiments, the random generator 2312 may generate a pseudo random sequence. The descrambler 2314 may descramble the LDPC decoded sequence to generate a descrambled sequence, using the random sequence. In various embodiments, the descrambler 2314 may descramble the LDPC decoded sequence by performing an XOR operation on the LDPC decoded sequence with the random sequence. The CRC syndrome calculator 2316 may calculate the CRC syndromes of the descrambled sequence to output a value of CRC syndrome.

Figure 25:
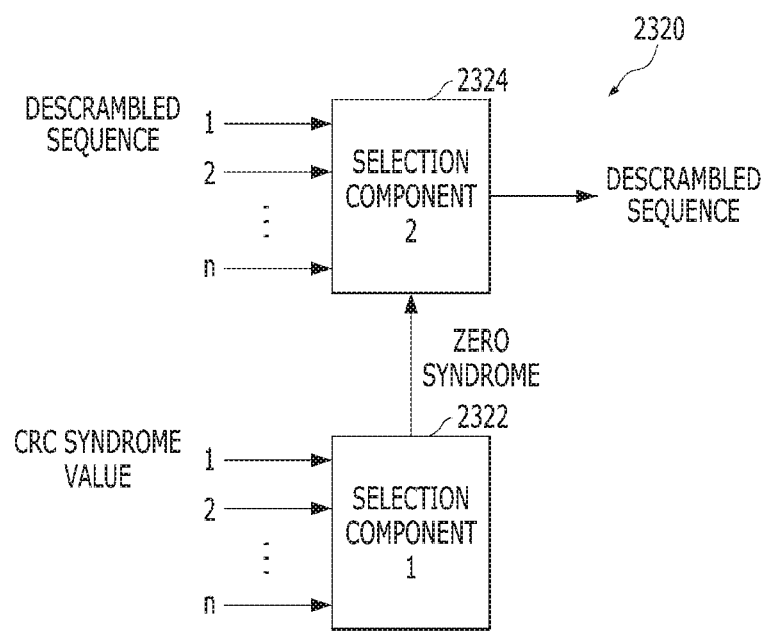
FIG. 25 is a diagram illustrating a selector in accordance with an embodiment of the present invention.

FIG. 25 is a diagram illustrating a selector in accordance with an embodiment of the present invention. For example, the selector of FIG. 25 may depict the selector 2320 shown in FIG. 23.

Referring to FIG. 25, the selector 2320 may include a first selection component 2322 and a second selection component 2324.

The first selection component 2322 may receive a plurality (e.g., n) of CRC syndrome values from calculators 2316 of the decoding components 2310_1 to 2310_n in FIGS. 23 and 24. The first selection component 2322 may select the CRC syndrome having a value of zero among the plurality of CRC syndrome values. The first selection component 2322 may output indication information indicating a random sequence among the plurality of random sequences, corresponding to the CRC syndrome value having the value of zero. The first selection component 2322 may output the indication information to the second selection component 2324.

The second selection component 2324 may receive a plurality (e.g., n) of descrambled sequences from scramblers 2314 of the decoding components 2310_1 to 2310_n in FIGS. 23 and 24. The second selection component 2324 may select the descrambled sequence to be recovered, among the plurality of descrambled sequences, based on the indication information. The second selection component 2324 may output the recovered sequence including the data bits.

Figure 26:
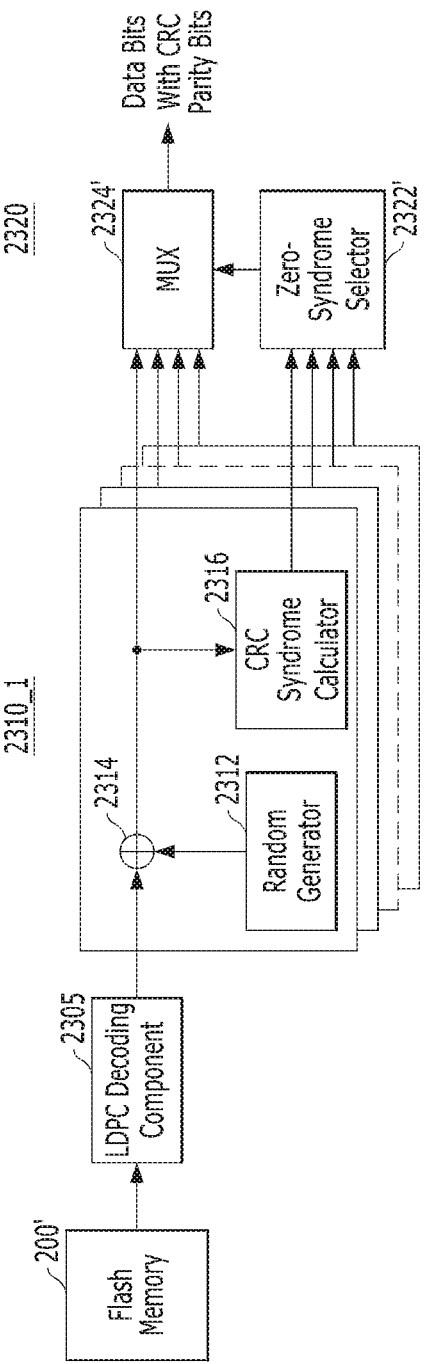
FIG. 26 is a diagram illustrating a memory controller and a memory device in accordance with an embodiment of the present invention.

FIG. 26 is a diagram illustrating a memory controller and a memory device in accordance with an embodiment of the present invention. For example, the memory controller 100 of FIG. 10 may include components shown in FIGS. 23 to 25, and the memory device 200 may include a flash memory device having multiple level cells such as triple-level cell (TLC).

Referring to FIG. 26, the memory controller 100 may include a low density parity check (LDPC) decoding component 2305, a plurality of decoding components and a selector 2320. Each of the plurality of decoding components 2310_1 may include a random generator 2312, a descrambler 2314 and a CRC syndrome calculator 2316. The selector 2320 may include a first selection component 2322 and a second selection component 2324 as shown in FIG. 25. The first selection component 2322 may be implemented with a selector 2322' for selecting a CRC syndrome having a value of zero among multiple CRC syndromes. The second selection component 2324 may be implemented with a multiplexer (MUX) 2324' for selecting a certain sequence among multiple input sequences.

The components of the memory controller 100 may read encoded sequence stored in the flash memory device 200' and recover data bits. To recover the data bits, the encoded sequence as the noisy codeword is read back from cells of the flash memory device 200'. The LDPC decoding component 2305 determines error locations of the encoded sequence and recovers the LDPC sequence (or codeword). Since the guided scrambling by the encoder 600A reduced the number of 1's in the encoded sequence, the average number of errors in the LDPC codeword will be lower, the decoder 600B will converge faster and have lower failure rate. After the decoding is complete, the LDPC codeword is descrambled (or XOR'd) with all candidate sequences (or random sequences) in parallel and the CRC syndrome is computed for all candidate sequences. The CRC syndrome will be all-zero for only the correct sequence and will be non-zero for all other candidates. This will be true when the CRC code is a linear code and the set of candidate sequences are chosen such that the XOR of any two of them is not a CRC codeword. This can be guaranteed by choosing the set of candidate sequences for guided scrambling using an offline search.

Figure 27:
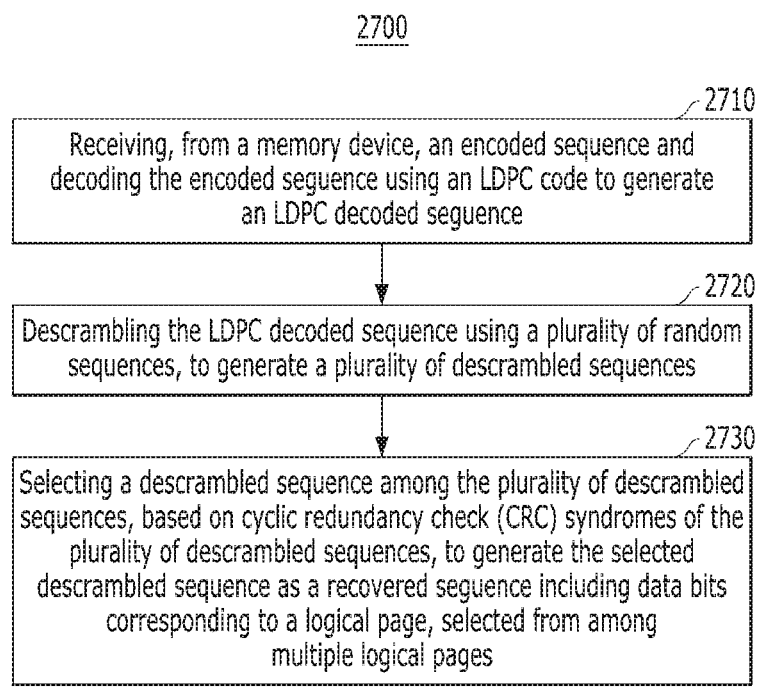
FIG. 27 is a flowchart illustrating an operation of a decoder in accordance with an embodiment of the present invention.

FIG. 27 is a flowchart illustrating a decoding operation 2700 of a decoder in accordance with an embodiment of the present invention. For example, the operation of FIG. 27 may be performed by the memory controller 100 including the decoder 600B of FIGS. 6 and 23 to 26. The memory controller 100 may control the memory device 200 including memory cells such as triple-level cells (TLCs) to perform a read operation on the memory cells.

Referring to FIG. 27, the decoding operation 2700 may include operations 2710, 2720 and 2730. The operation 2710 may include receiving, from the memory device 20, an encoded sequence, and decoding the encoded sequence using a low density parity check (LDPC) code to generate an LDPC decoded sequence.

The operation 2720 may include descrambling the LDPC decoded sequence using a plurality of random sequences, to generate a plurality of descrambled sequences. In various embodiments, the descrambling may be carried out by a plurality of descramblers.

In various embodiments, the operation 2720 may include descrambling the LDPC decoded sequence by performing an XOR operation on the LDPC decoded sequence with a corresponding random sequence among the plurality of random sequences.

The operation 2730 may include selecting a descrambled sequence to be recovered, among the plurality of descrambled sequences, based on cyclic redundancy check (CRC) syndromes of the plurality of descrambled sequences. The recovered sequence includes data bits corresponding to a logical page, selected from among multiple logical pages.

In various embodiments, the selected descrambled sequence may have the lowest number of logical high values, among a plurality of scrambled sequences, which are generated by scrambling the data bits using the plurality of random sequences.

In various embodiments, the operation 2730 may be performed by a first selection component and a second selection component. The first selection component may perform an operation of receiving the CRC syndromes, selecting a CRC syndrome among the CRC syndromes, the selected CRC syndrome having a value of zero, and outputting indication information indicating the selected CRC syndrome. The second selection component may perform an operation of receiving the plurality of descrambled sequences, selecting the descrambled sequence to be recovered, among the plurality of descrambled sequences, based on the indication information, recovering the selected descrambled sequence, and outputting the recovered sequence.

In various embodiments, the multiple logical pages may include a most significant bit (MSB) page, a center significant bit (CSB) page and a least significant bit (LSB) page. In various embodiments, the selected logical page may include the MSB page. Alternatively, the selected logical page may include a logical page having a ratio of a probability of a stored logical high value read incorrectly as a logical low value (first probability) to a probability of a stored logical low value read incorrectly as a logical high value (second probability).

As described above, the memory system including the encoder and decoder in accordance with embodiments may perform encoding operations using multiple scrambling (i.e., guided scrambling), thus reducing the occurrences of a certain bit value (i.e., a logical high value "1" or bit-1) before a program operation.

Although the foregoing embodiments have been illustrated and described in some detail for purposes of clarity and understanding, the present invention is not limited to the details provided. There are many alternative ways of implementing the invention, as one skilled in the art will appreciate in light of the foregoing disclosure. The disclosed embodiments are thus illustrative, not restrictive. The present invention is intended to embrace all modifications and alternatives that fall within the scope of the claims.

What is claimed is:

1. A system comprising:
a memory device including multiple level cells; and
a controller including an encoder suitable for:
generating a plurality of random sequences and scrambling data bits corresponding to a logical page, selected from among multiple logical pages, using the plurality of random sequences, to generate a plurality of scrambled sequences;
selecting, as an encoded sequence, a scrambled sequence among the plurality of scrambled sequences; and
providing the memory device with the encoded sequence to store the encoded sequence in the multiple level cells,
wherein the selected scrambled sequence has the lowest number of logical high values among the plurality of scrambled sequences.

2. The system of claim 1, wherein the encoder includes:
a plurality of random generators suitable for generating the plurality of random sequences;
a plurality of scramblers suitable for scrambling the data bits to generate the plurality of scrambled sequences, using the plurality of random sequences, wherein each of the plurality of scramblers scrambles the data bits, using the corresponding random sequence among the plurality of random sequences; and
a selector suitable for selecting, as the encoded sequence, the scrambled sequence having the lowest number of logical high values among the plurality of scrambled sequences,
wherein the encoder includes a plurality of encoding components, each of the plurality of encoding components including a corresponding random generator among the plurality of random generators and a corresponding scrambler among the plurality of scramblers.

3. The system of claim 2, wherein each of the plurality of scramblers scrambles the data bits by performing an XOR operation on the data bits with a corresponding random sequence among the plurality of random sequences.

4. The system of claim 3, wherein the multiple level cells include triple-level cells (TLCs), and the multiple logical pages include a most significant bit (MSB) page, a center significant bit (CSB) page and a least significant bit (LSB) page.

5. The system of claim 4, wherein the selected logical page includes the MSB page.

6. The system of claim 4, wherein the selected logical page includes a logical page having a ratio of a first probability to a second probability that is greater than a threshold value, the first probability indicating a probability of a logical high value stored in the memory device being incorrectly read as a logical low value, and the second probability indicating a probability of a logical low value stored in the memory device being incorrectly read as a logical high value.

7. The system of claim 4, wherein the encoder further includes a plurality of counters suitable for outputting a plurality of counted values,
each of the plurality of counters suitable for counting the number of the logical high value in a corresponding scrambled sequence among the plurality of scrambled sequences, to output a corresponding counted value, and
each of the plurality of encoding components including a corresponding counter among the plurality of counters.

8. The system of claim 4, wherein the selector includes:
a first selection component suitable for receiving the plurality of counted values, selecting the lowest counted value among the plurality of counted values and outputting, to the memory device, indication information indicating a random sequence among the plurality of random sequences, corresponding to the lowest counted value; and
a second selection component suitable for receiving the plurality of scrambled sequences, selecting the encoded sequence based on the indication information and outputting, to the memory device, the encoded sequence.

9. The system of claim 4, further comprising:
a first encoding component suitable for encoding the data bits using a cyclic redundancy check (CRC) code, and outputting the encoded data bits to each of the plurality of encoding components; and
a second encoding component suitable for receiving the encoded sequence, encoding the encoded sequence using a low density parity check (LDPC) code and outputting the LDPC encoded sequence to the memory device.

10. A system comprising:
a memory device including multiple level cells, in which an encoded sequence is stored; and
a controller including a decoder suitable for:
generating a plurality of random sequences;
receiving, from the memory device, the encoded sequence and indication information;
selecting a random sequence among the plurality of random sequences, based on the indication information; and
descrambling the encoded sequence using the selected random sequence to generate a descrambled sequence as data bits corresponding to a logical page, selected from among multiple logical pages,
wherein the indication information indicates the random sequence corresponding to a scrambled sequence having a lowest number of logical high values, among a plurality of scrambled sequences, which is generated by scrambling the data bits using the plurality of random sequences.

11. The system of claim 10, wherein the decoder includes:
a plurality of random generators suitable for generating the plurality of random sequences;
a plurality of descramblers; and
a selector suitable for selecting a random generator among the plurality of random generators and a descrambler among the plurality of descramblers, based on the indication information, such that the selected descrambler descrambles the encoded sequence using a corresponding random sequence generated by the selected random generator,
wherein the decoder includes a plurality of decoding components, each of the plurality of decoding components including a corresponding random generator among the plurality of random generators and a corresponding descrambler among the plurality of descramblers.

12. The system of claim 10, wherein the selected descrambler descrambles the encoded sequence by performing an XOR operation on the encoded sequence with the selected random sequence.

13. The system of claim 12, wherein the multiple level cells include triple-level cells (TLCs), and the multiple logical pages include a most significant bit (MSB) page, a center significant bit (CSB) page and a least significant bit (LSB) page.

14. The system of claim 13, wherein the selected logical page includes the MSB page.

15. The system of claim 13, wherein the selected logical page includes a logical page having a ratio of a first probability to a second probability that is greater than a threshold value, the first probability indicating a probability of a logical high value stored in the memory device being incorrectly read as a logical low value, and the second probability indicating a probability of a logical low value stored in the memory device being incorrectly read as a logical high value.

16. A system comprising:
a memory device including multiple level cells, in which an encoded sequence is stored; and
a controller including a decoder suitable for:
receiving, from the memory device, the encoded sequence;
decoding the encoded sequence using a low density parity check (LDPC) code to generate an LDPC decoded sequence;
generating a plurality of random sequences;
descrambling the LDPC decoded sequence using the plurality of random sequences, to generate a plurality of descrambled sequences; and
selecting a descrambled sequence to be recovered, among the plurality of descrambled sequences, based on cyclic redundancy check (CRC) syndromes of the plurality of descrambled sequences, to generate a recovered sequence including data bits corresponding to a logical page, selected from among multiple logical pages,
wherein the selected descrambled sequence has the lowest number of logical high values, among a plurality of scrambled sequences, which were generated by scrambling the data bits using the plurality of random sequences.

17. The system of claim 16, wherein the decoder includes:
a plurality of random generators suitable for generating the plurality of random sequences;
a plurality of descramblers suitable for descrambling the LDPC decoded sequence using the plurality of random sequences, to generate the plurality of descrambled sequences, wherein each of the plurality of descramblers descrambles the LDPC decoded sequence, using the corresponding random sequence; and
a selector suitable for selecting the descrambled sequence based on the CRC syndromes,
wherein the decoder includes a plurality of decoding components, each including a corresponding random generator among the plurality of random generators and a corresponding descrambler among the plurality of descramblers.

18. The system of claim 17, wherein each of the plurality of descramblers descrambles the LDPC decoded sequence by performing an XOR operation on the LDPC decoded sequence with a corresponding random sequence among the plurality of random sequences.

19. The system of claim 18, wherein the multiple level cells include triple-level cells (TLCs), and the multiple logical pages include a most significant bit (MSB) page, a center significant bit (CSB) page and a least significant bit (LSB) page.

20. The system of claim 19, wherein the selected logical page includes the MSB page.

21. The system of claim 19, wherein the selected logical page includes a logical page having a ratio of a first probability to a second probability that is greater than a threshold value, the first probability indicating a probability of a logical high value stored in the memory device being incorrectly read as a logical low value, and the second probability indicating a probability of a logical low value stored in the memory device being incorrectly read as a logical high value.

22. The system of claim 19, wherein the decoder further includes a plurality of calculators suitable for calculating the CRC syndromes of the plurality of descrambled sequences,
each of the plurality of calculators suitable for calculating a corresponding CRC syndrome among the CRC syndromes, and each of the plurality of decoding components including a corresponding calculator among the plurality of calculators.

23. The system of claim 22, wherein the selector includes:

a first selection component suitable for receiving the CRC syndromes, selecting a CRC syndrome among the CRC syndromes, the selected CRC syndrome having a value of zero, and outputting indication information indicating the selected CRC syndrome; and a second selection component suitable for receiving the plurality of descrambled sequences, selecting the descrambled sequence among the plurality of descrambled sequences based on the indication information and outputting the selected descrambled sequence as the recovered sequence.

* * * * *